(12) United States Patent
Shiraishi

(10) Patent No.: US 8,023,100 B2
(45) Date of Patent: Sep. 20, 2011

(54) EXPOSURE APPARATUS, SUPPLY METHOD AND RECOVERY METHOD, EXPOSURE METHOD, AND DEVICE PRODUCING METHOD

(75) Inventor: Kenichi Shiraishi, Saitawa (JP)

(73) Assignee: Nikon Corporation, Tokyo (JP)

( * ) Notice: Subject to any disclaimer, the term of this patent is extended or adjusted under 35 U.S.C. 154(b) by 403 days.

(21) Appl. No.: 10/589,437

(22) PCT Filed: Feb. 17, 2005

(86) PCT No.: PCT/JP2005/002461
§ 371 (c)(1),
(2), (4) Date: Aug. 1, 2007

(87) PCT Pub. No.: WO2005/081292
PCT Pub. Date: Sep. 1, 2005

(65) Prior Publication Data
US 2008/0100810 A1     May 1, 2008

(30) Foreign Application Priority Data
Feb. 20, 2004   (JP) .............................. P2004-045102

(51) Int. Cl.
*G03B 27/52*     (2006.01)
(52) U.S. Cl. .......................................... 355/30; 355/53
(58) Field of Classification Search ............... 355/30, 355/53
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |

(Continued)

FOREIGN PATENT DOCUMENTS

DE          221 563        9/1983

(Continued)

OTHER PUBLICATIONS

European Search Report dated Oct. 23, 2008 for corresponding European Patent Application No. 05 710 311.1.

(Continued)

*Primary Examiner* — Edward J Glick
*Assistant Examiner* — Mesfin T Asfaw

(57) ABSTRACT

The present invention provides an exposure apparatus that can prevent the degradation of exposure and measurement accuracies. An exposure apparatus (EX) exposes a substrate (P) by irradiating the substrate (P) with exposure light (EL) through a projection optical system (PL) and a liquid (LQ), and comprises: a liquid supply mechanism (10) that supplies the liquid (LQ) between an optical element (2) at the image plane side tip part of the projection optical system (PL) and a substrate (P) that opposes the optical element (2); a timer (60) that measures the time that has elapsed since the supply of the liquid by the liquid supply mechanism (10) was started; and a control apparatus (CONT) that determines, based on a measurement result of the timer (60), whether a space(SP), which is between the optical element (2) and the substrate (P) and includes at least an optical path of the exposure light (EL), is filled with the liquid (LQ).

29 Claims, 6 Drawing Sheets

U.S. PATENT DOCUMENTS

| | | | |
|---|---|---|---|
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,437,851 B2 | 8/2002 | Hagiwara | |
| 6,549,269 B1 | 4/2003 | Nishi et al. | |
| 6,590,634 B1 | 7/2003 | Nishi et al. | |
| 7,557,900 B2 | 7/2009 | Shiraishi | |
| 2001/0019399 A1 | 9/2001 | Hagiwara | |
| 2001/0055101 A1 | 12/2001 | Hayashi | |
| 2004/0165159 A1 | 8/2004 | Lof et al. | |
| 2005/0024609 A1 | 2/2005 | De Smit et al. | |
| 2005/0030497 A1 | 2/2005 | Nakamura | |
| 2005/0037269 A1* | 2/2005 | Levinson | 430/30 |
| 2005/0094125 A1* | 5/2005 | Arai | 355/72 |
| 2005/0264774 A1 | 12/2005 | Mizutani et al. | |
| 2006/0132737 A1 | 6/2006 | Magome et al. | |
| 2006/0164615 A1* | 7/2006 | Hirukawa | 355/53 |

FOREIGN PATENT DOCUMENTS

| | | |
|---|---|---|
| DE | 224 448 | 7/1985 |
| EP | 1 724 815 A1 | 11/2006 |
| JP | 57-117238 | 7/1982 |
| JP | 58-202448 | 11/1983 |
| JP | 59-19912 | 2/1984 |
| JP | 62-65326 | 3/1987 |
| JP | 63-157419 | 6/1988 |
| JP | 4-065603 | 3/1992 |
| JP | 4-65603 | 3/1992 |
| JP | 04-190873 | 7/1992 |
| JP | 4-190873 | 7/1992 |
| JP | 4-305915 | 10/1992 |
| JP | 4-305917 | 10/1992 |
| JP | 5-62877 | 3/1993 |
| JP | 6-53120 | 2/1994 |
| JP | 6-124873 | 5/1994 |
| JP | 6-188169 | 7/1994 |
| JP | 7-176468 | 7/1995 |
| JP | 7-220990 | 8/1995 |
| JP | 8-037149 | 2/1996 |
| JP | 8-37149 | 2/1996 |
| JP | 8-45816 | 2/1996 |
| JP | 8-166475 | 6/1996 |
| JP | 8-316125 | 11/1996 |
| JP | 8-330224 | 12/1996 |
| JP | 9-283430 | 10/1997 |
| JP | 10-163099 | 6/1998 |
| JP | 10-214783 | 8/1998 |
| JP | 10-303114 | 11/1998 |
| JP | 10-340846 | 12/1998 |
| JP | 11-16816 | 1/1999 |
| JP | 11-135400 | 5/1999 |
| JP | 11-176727 | 7/1999 |
| JP | 11-233406 | 8/1999 |
| JP | 2000-58436 | 2/2000 |
| JP | 2000-505958 | 5/2000 |
| JP | 2001-345263 | 12/2001 |
| JP | 2002-14005 | 1/2002 |
| JP | 2005-5713 | 1/2005 |
| WO | WO 99/49504 | 9/1999 |
| WO | WO 2004/019128 | 3/2004 |
| WO | WO 2004/053958 | 6/2004 |
| WO | WO 2005/010962 | 3/2005 |
| WO | WO 2005/081292 | 9/2005 |

OTHER PUBLICATIONS

PCT Search Report dated Feb. 17, 2005, for related priority PCT Patent Application No. PCT/JP2005/002461.

European Office Action mailed Feb. 24, 2009 issued with respect to European patent application No. 05 710 311.1-1226.

International Search Report mailed May 31, 2005 issued with respect to PCT/JP2005/002461.

Written Opinion mailed May 31, 2005 issued with respect to PCT/2005/002461.

Japanese Office Action issued on the counterpart Japanese Patent Application No. 2006-510223 on Apr. 26, 2011.

Korean Office Action issued Apr. 29, 2011 in corresponding Korean Patent Application 2006-7019407.

Japanese Office Action issued Apr. 26, 2011 in corresponding Japanese Patent Application 2006-510223.

* cited by examiner

EXPOSURE APPARATUS, SUPPLY METHOD AND RECOVERY METHOD, EXPOSURE METHOD, AND DEVICE PRODUCING METHOD

TECHNICAL FIELD

The present invention relates to an exposure apparatus, which exposes a substrate by irradiating such with exposure light through a projection optical system and a liquid, a liquid supplying method, a liquid recovering method, and a device fabricating method.

The disclosure of the following priority application is hereby incorporated by reference in its entirety: Japanese Patent Application No. 2004-45102, filed on Feb. 20, 2004.

BACKGROUND ART

Semiconductor devices and liquid crystal display devices are fabricated by a so-called photolithography technique, wherein a pattern formed on a mask is transferred onto a photosensitive substrate. An exposure apparatus used in this photolithographic process comprises a mask stage that supports a mask as well as a substrate stage that supports a substrate, and transfers the pattern of the mask onto the substrate through a projection optical system while successively moving the mask stage and the substrate stage. In recent years, there has been demand for higher resolution projection optical systems in order to handle the much higher levels of integration of device patterns. The shorter the exposure wavelength used and the larger the numerical aperture of the projection optical system, the higher the resolution of the projection optical system. Consequently, the exposure wavelength used in exposure apparatuses has shortened year by year, and the numerical aperture of projection optical systems has increased. Furthermore, the current mainstream exposure wavelength is 248 nm, which is the wavelength of light produced by a KrF excimer laser, but an even shorter 193 nm wavelength ArF excimer laser is also being commercialized.

In addition, as with resolution, the depth of focus (DOF) is important when performing an exposure. The following equations express the resolution R and the depth of focus δ, respectively.

$$R = k_1 \cdot \lambda / NA \quad (1)$$

$$\delta = \pm k_2 \cdot \lambda / NA^2 \quad (2)$$

Therein, λ is the exposure wavelength, NA is the numerical aperture of the projection optical system, and $k_1$ and $k_2$ are the process coefficients. Equations (1) and (2) teach that if the exposure wavelength λ is shortened and the numerical aperture NA is increased in order to enhance the resolution R, then the depth of focus δ decreases.

If the depth of focus δ becomes excessively small, then it will become difficult to align the front surface of the substrate with the image plane of the projection optical system, which creates a risk that the margin of focus will be insufficient during the exposure operation. Accordingly, a liquid immersion method has been proposed, as disclosed in, for example, Patent Document 1 below, as a method to substantially shorten the exposure wavelength and increase the depth of focus. This liquid immersion method forms an immersion area by filling a liquid, such as water or an organic solvent, between the lower surface of the projection optical system and the front surface of the substrate, thus taking advantage of the fact that the wavelength of the exposure light in a liquid is 1/n that of in air (where n is the refractive index of the liquid, normally about 1.2-1.6), thereby improving the resolution as well as increasing the depth of focus by approximately n times.

PATENT DOCUMENT 1: PCT International Publication WO99/49504

DISCLOSURE OF INVENTION

Problems Solved by the Invention

Incidentally, it is important in a liquid immersion exposure apparatus to satisfactorily form a liquid immersion area. For example, unless an immersion area of the liquid between the substrate and the image plane side tip part of the projection optical system is satisfactorily formed, phenomena occur, such as the exposure light, which forms the pattern image on the substrate, not reaching the substrate or not reaching the desired position on the substrate, which invites a degradation in exposure accuracy. In addition, a constitution is also conceivable that performs a measurement process through the liquid of the immersion area; however, even in that case, unless the immersion area is satisfactorily formed, phenomena occur, such as the measurement beam not reaching a measuring instrument, or not reaching a desired position, which invites a degradation of measurement accuracy. Accordingly, it is important to determine whether the immersion area is satisfactorily formed, and to take appropriate measures if needed.

In addition, after performing an exposure process, a measurement process, and the like using the immersion area of the liquid, it is also important to satisfactorily recover that liquid. If the liquid cannot be sufficiently recovered, then there is a possibility that the residual liquid will flow out to the outer side of the substrate, the substrate stage, and the like, and affect peripheral equipment, peripheral members, and the like. In addition, if the residual liquid is left for a long period of time, then, when that liquid dries, adhered residue (a so-called watermark) will form on the measuring member on the substrate stage, the image plane side tip part of the projection optical system, and the like, and foreign matter will adhere, which will invite a degradation in exposure and measurement accuracies. In addition, if the substrate is unloaded from the substrate stage in a state wherein the liquid on the substrate is not completely recovered, then the liquid will scatter along the transport pathway and affect the equipment and members along such. Accordingly, it is important to determine whether the liquid has been satisfactorily recovered, and to take appropriate measures if needed.

The present invention considers such circumstances, and it is an object of the present invention to provide: an exposure apparatus that can prevent the degradation of the exposure and measurement accuracies; a liquid supplying method; a liquid recovering method; and a device fabricating method.

Means for Solving the Problems

To solve the abovementioned problems, the present invention adopts the following constitution corresponding to FIG. 1 through FIG. 7, which describe the embodiments. Furthermore, to explain the present invention so that it is easy to understand, the symbols in the drawings that show one embodiment are assigned to corresponding constituent elements, but the present invention is not limited thereto.

An exposure apparatus (EX) of the present invention is an exposure apparatus that exposes a substrate (P) by irradiating the substrate (P) with exposure light (EL) through a projection optical system (PL) and a liquid (LQ), comprising: a liquid supply mechanism (10) that supplies the liquid (LQ) between an image plane side tip part (2) of the projection optical system (PL) and an object (P, PST, 300, 400, 500, 600, and the like) that opposes the tip part (2); a timer (60) that measures the time that has elapsed since the supply of the liquid by the liquid supply mechanism (10) was started; and a control apparatus (CONT) that determines, based on a measurement result of the timer (60), whether the space (SP), which is between the image plane side tip part (2) of the projection optical system (PL) and the object (P, PST, 300, 400, 500, 600, and the like) and includes at least an optical path of the exposure light (EL), is filled with the liquid (LQ).

According to this aspect of the present invention, by using the timer to measure the time that has elapsed since the supply of the liquid was started by the liquid supply mechanism, it is possible to determine whether the space, which is between the image plane side tip part of the projection optical system and the object, is filled with the liquid based on, for example, a preset prescribed time and the measurement result of the timer. Accordingly, it can be easily determined, with a comparatively simple constitution, whether the space is filled with the liquid without newly constructing a system for detecting the liquid in the space. Furthermore, because the exposure process and the measurement process can be performed through the liquid after the space is filled with such, exposure and measurement accuracies can be maintained.

An exposure apparatus (EX) of the present invention is an exposure apparatus that exposes a substrate (P) by irradiating the substrate (P) with exposure light (EL) through a projection optical system (PL) and a liquid (LQ), comprising: a liquid supply mechanism (10) that supplies the liquid (I,Q) between an image plane side tip part (2) of the projection optical system (PL) and an object (P, PST, 300, 400, 500, 600, and the like) that opposes the tip part (2); a timer (60) that measures the time that has elapsed since the supply of the liquid (LQ) by the liquid supply mechanism (10) was stopped; a liquid recovery mechanism (20) that recovers the liquid (LQ) while the liquid (LQ) is being supplied by the liquid supply mechanism (10), as well as after such supply has stopped; and a control apparatus (CONT) that determines, based on a measurement result of the timer (60), whether the liquid (LQ) has been recovered from the space (SP) between the image plane side tip part (2) of the projection optical system (PL) and the object (P, PST, 300, 400, 500, 600, and the like).

According to this aspect of the present invention, by using the timer to measure the time that has elapsed since the supply of the liquid by the liquid supply mechanism was stopped, it is also possible to determine whether the liquid has been recovered from the space, which is between the image plane side tip part of the projection optical system and the object, based on, for example, a preset prescribed time and the measurement result of the timer. Accordingly, it is possible to easily determine, with a comparatively simple constitution, whether the liquid has been recovered without newly constructing a system for detecting the liquid in the space. Furthermore, it is possible to perform a predetermined process, such as unloading the substrate after recovering the liquid, or measuring without going through the liquid, and it is therefore possible to prevent the occurrence of problems, such as the scattering of the liquid, and to maintain exposure and measurement accuracies.

An exposure apparatus (EX) of the present invention is an exposure apparatus that exposes a substrate (P) by irradiating the substrate (P) with exposure light (EL) through a projection optical system (PL) and a liquid (LQ), comprising: a liquid supply mechanism (10) that supplies the liquid (LQ) between an image plane side tip part (2) of the projection optical system (PL) and an object (P, PST, 300, 400, 500, 600, and the like) that opposes the tip palr (2); a liquid recovery mechanism (20) that recovers the liquid (LQ); a first measuring instrument (16) that measures the amount of liquid supplied by the liquid supply mechanism (10); a second measuring instrument (26) that measures the amount of liquid recovered by the liquid recovery mechanism (20); and a control apparatus (CONT) that determines, based on the measurement results of the first measuring instrument (16) and the second measuring instrument (26), whether the space (SP), which is between the image plane side tip part (2) of the projection optical system (PL) and an object (P, PST, 300, 400, 500, 600, and the like) opposing the tip part (2) and includes at least an optical path of the exposure light (EL), is filled with the liquid (LQ).

According to this aspect of the present invention, by using the first and second measuring instruments to measure the amount of the liquid supplied and recovered, it is possible to determine whether the space, which is between the image plane side tip part of the projection optical system and the object, is filled with the liquid based on, for example, the difference between those measurement results. Accordingly, it can be easily determined with a comparatively simple constitution, whether the space is filled with the liquid without newly constructing a system for detecting the liquid in the space. Furthermore, because the exposure process and the measurement process can be performed through the liquid after the space is filled with such, exposure and measurement accuracies can be maintained.

An exposure apparatus (EX) of the present invention is an exposure apparatus that exposes a substrate (P) by irradiating the substrate (P) with exposure light (EL) through a projection optical system (PL) and a liquid (LQ), comprising: a liquid supply mechanism (10) that supplies the liquid (LQ) to a space (SP) between an image plane side tip part (2) of the projection optical system (PL) and an object (P, PST, 300, 400, 500, 600, and the like) that opposes the tip part (2); a liquid recovery mechanism (20) that recovers the liquid (LQ); a measuring instrument (26) that measures the amount of liquid recovered by the liquid recovery mechanism (20) since the supply of the liquid by the liquid supply mechanism (10) was stopped; and a control apparatus (CONT) that determines, based on the measurement result of the measuring instrument (26), whether the liquid (LQ) has been recovered from the space (SP).

According to this aspect of the present invention, by using the measuring instrument to measure the amount of the liquid recovered since the supply of the liquid was stopped, it is also possible to determine whether the liquid has been recovered from the space, which is between the image plane side tip part of the projection optical system and an object, based on that measurement result. Accordingly, it is possible to easily determine, with a comparatively simple constitution, whether the liquid has been recovered without newly constructing a system for detecting the liquid in the space. Furthermore, it is possible to perform a predetermined process, such as unloading the substrate after recovering the liquid, or measuring without going through the liquid, and it is therefore possible to prevent the occurrence of problems, such as the scattering of the liquid, and to maintain exposure and measurement accuracies.

A supplying method according to this aspect of the present invention is a supplying method that supplies a liquid (LQ) to a space (SP) between an image plane side tip part (2) of a projection optical system (PL) and an object (P, PST, 300,

400, 500, 600 and the like) that opposes the tip part, comprising the steps of: supplying the liquid (LQ) to the space (SP); measuring the time that has elapsed since the start of the supply; and determining that the space (SP) is filled with the liquid (LQ) at a point in time when the elapsed time exceeds a prescribed time.

According to this aspect of the present invention, by measuring the time that has elapsed since the supply of the liquid was started, it is possible to determine whether the space, which is between the image plane side tip part of the projection optical system and the object, is filled with the liquid at the point in time when that measured elapsed time exceeds, for example, a preset prescribed time. Accordingly, it can be easily determined, with a comparatively simple constitution, whether the space is filled with the liquid without newly constructing a system for detecting the liquid in the space. Furthermore, because the exposure process and the measurement process can be performed through the liquid after the space is filled with such, exposure and measurement accuracies can be maintained.

A supplying method of the present invention is a supplying method that supplies a liquid (LQ) to a space (SP) between an image plane side tip part (2) of a projection optical system (PL) and an object (P, PST, 300, 400, 500, 600, and the like) that opposes the tip part (2), comprising the steps of: simultaneously supplying and recovering the liquid (LQ) to and from the space (SP); measuring an amount of liquid (LQ) supplied and an amount of liquid (LQ) recovered per unit of time; and determining that the space (SP) is filled with the liquid (LQ) at at least one of the point in time when the difference between the amount supplied and the amount recovered has become less than a prescribed value, or the point in time when a prescribed time has elapsed since the difference between the amount supplied and the amount recovered became less than the prescribed value.

According to this aspect of the present invention, by measuring the amount of liquid supplied and the amount of liquid recovered, it is possible to determine whether the space, which is between the image plane side tip part of the projection optical system and the object, is filled with the liquid based on, for example, the difference between those measurement results. Accordingly, it can be easily determined, with a comparatively simple constitution, whether the space is filled with the liquid without newly constructing a system for detecting the liquid in the space. Furthermore, because the exposure process and the measurement process can be performed through the liquid after the space is filled with such, exposure and measurement accuracies can be maintained.

A recovering method according to this aspect of the present invention is a recovering method that recovers a liquid (LQ) that is filled in a space (SP) between an image plane side tip part (2) of a projection optical system (PL) and an object (P, PST, 300, 400, 500 and the like) that opposes the tip part (2), comprising the steps of: simultaneously supplying and recovering the liquid (LQ) to and from the space (SP); stopping the supply of the liquid (LQ); measuring the time that has elapsed since the stopping; and determining that the recovery of the liquid (LQ) that filled the space (SP) is complete at the point in time when the elapsed time exceeds a prescribed time.

According to this aspect of the present invention, by measuring the time that has elapsed since the supply of the liquid was stopped, it is also possible to determine whether the liquid has been recovered from the space, which is between the image plane side tip part of the projection optical system and the object, at the point in time when that measured elapsed time exceeds, for example, a preset prescribed time. Accordingly, it is possible to easily determine, with a comparatively simple constitution, whether the liquid has been recovered without newly constructing a system for detecting the liquid in the space. Furthermore, it is possible to perform a predetermined process, such as unloading the substrate after recovering the liquid, or measuring without going through the liquid, and it is therefore possible to prevent the occurrence of problems, such as the scattering of the liquid, and to maintain exposure and measurement accuracies.

A recovering method according to this aspect of the present invention is a recovering method that recovers a liquid (LQ) that fills a space (SP) between an image plane side tip part (2) of a projection optical system (PL) and an object (P, PST, 300, 400, 500, 600, and the like) that opposes the tip part (2), comprising the steps of: simultaneously supplying and recovering the liquid (LQ) to and from the space (SP); measuring an amount of liquid (LQ) supplied and an amount of liquid (LQ) recovered per unit of time; stopping the supply of the liquid (LQ); and determining that the recovery of the liquid (LQ) that fills the space (SP) is complete at at least one of the point in time when the amount recovered has become less than a prescribed amount, or the point in time when a prescribed time has elapsed since the amount recovered became less than a prescribed value.

According to this aspect of the present invention, by measuring the amount of liquid recovered since the supply of the liquid was stopped, it is also possible to determine whether the liquid has been recovered from the space, which is between an image plane side tip part of a projection optical system and an object, based on that measurement result. Accordingly, it is possible to easily determine, with a comparatively simple constitution, whether the liquid has been recovered without newly constructing a system for detecting the liquid in the space. Furthermore, it is possible to perform a predetermined process, such as unloading the substrate after recovering the liquid, or measuring without going through the liquid, and it is therefore possible to prevent the occurrence of problems, such as the scattering of the liquid, and to maintain exposure and measurement accuracies.

An exposing method according to this aspect of the present invention is an exposing method that supplies a liquid to a space, which is between an image plane side tip part of a projection optical system and an object that opposes the tip part, and exposes the object through the liquid, comprising the step of: supplying the liquid using the supplying method as recited above. According to this aspect of the present invention, it is possible to easily determine, with a comparatively simple constitution, whether the supply of the liquid is complete, and then perform an exposure.

An exposing method according to this aspect of the present invention is an exposing method that supplies a liquid to a space, which is between an image plane side tip part of a projection optical system and an object that opposes the tip part, and exposes the object through the liquid, comprising the step of: recovering the liquid using the recovering method as recited above. According to this aspect of the present invention, it is possible to easily determine, with a comparatively simple constitution, whether the recovery of the liquid is complete, and to promptly execute successive processes.

A device fabricating method of the present invention uses the exposure apparatus (EX) as recited above. According to this aspect of the present invention, devices can be fabricated in a state wherein the exposure and measurement accuracies are satisfactorily maintained, and it is therefore possible to fabricate devices that exhibit the desired performance.

Advantageous Effects of the Invention

According to the present invention, it is possible to satisfactorily maintain exposure and measurement accuracies.

DESCRIPTION OF THE REFERENCE SYMBOLS

2 Optical element (tip part)
10 Liquid supply mechanism
12 Supply port
13 Supply pipe (passage)
15 Valve
16 First flow meter (first measuring instrument)
20 Liquid recovery mechanism
26 Second flow meter (second measuring instrument)
30 Focus detection system (detector)
60 Timer
CONT Control apparatus
EL Exposure light
EX Exposure apparatus
LQ Liquid
P Substrate (object)
PL Projection optical system
PST Substrate stage (object)
SP Space

BEST MODE FOR CARRYING OUT THE INVENTION

Figure 1:
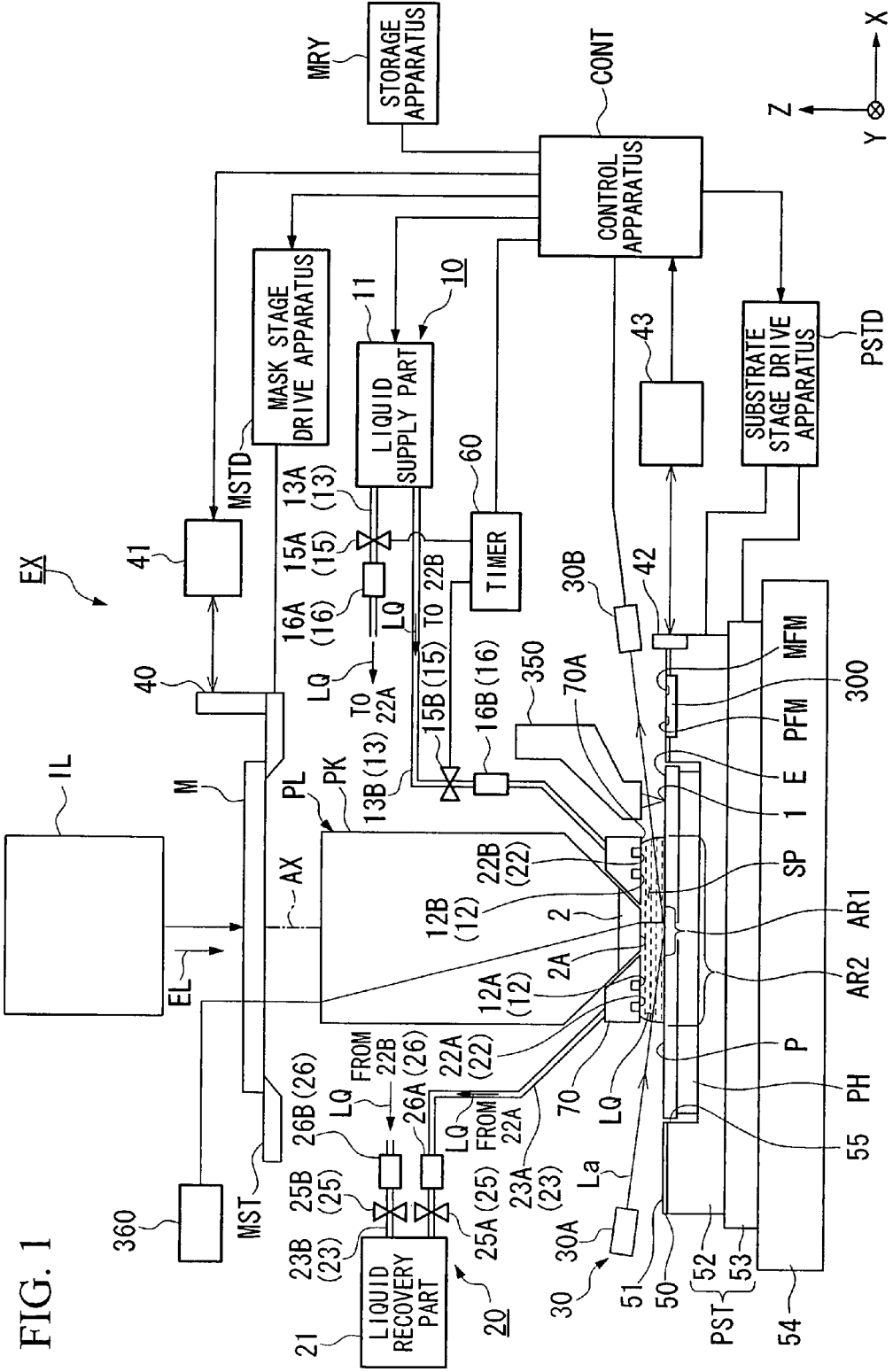
FIG. 1 is a schematic block diagram that shows one embodiment of an exposure apparatus of the present invention.

The following explains an exposure apparatus of the present invention, referencing the drawings. FIG. 1 is a schematic block diagram that depicts one embodiment of the exposure apparatus of the present invention.

In FIG. 1, an exposure apparatus EX comprises: a movable mask stage MST that supports a mask M; a movable substrate stage PST that has a substrate holder PH, which holds a substrate P; an illumination optical system IL that illuminates the mask M, which is supported by the mask stage MST, with an exposure light EL; a projection optical system PL that exposes the substrate P, which is supported by the substrate stage PST, by projecting an image of a pattern of the mask M, which is illuminated by the exposure light EL, thereon; a timer 60 that measures time; a control apparatus CONT that performs supervisory control of the operation of the entire exposure apparatus EX; and a storage apparatus MRY, which is connected to the control apparatus CONT, that stores various information related to an exposure process.

The exposure apparatus EX of the present embodiment is a liquid immersion-type exposure apparatus, wherein the liquid immersion method is adapted in order to substantially shorten the exposure wavelength. improve the resolution, as well as substantially increase the depth of focus, that comprises a liquid supply mechanism 10, which supplies the liquid LQ onto the substrate P, and a liquid recovery mechanism 20, which recovers the liquid LQ on the substrate P. In the present embodiment, pure water is used as the liquid LQ. At least during the transfer of the pattern image of the mask M onto the substrate P, the exposure apparatus EX locally forms an immersion area AR2, which is larger than a projection area AR1 and smaller than the substrate P, with the liquid LQ, which is supplied by the liquid supply mechanism 10, on at least one part of the substrate P that includes the projection area AR1 of the projection optical system PL. Specifically, the exposure apparatus EX supplies the liquid LQ via the liquid supply mechanism 10 to a space SP between an optical element 2 of an image plane side tip part of the projection optical system PL and the front surface (exposure surface) of the substrate P opposing that optical element 2. Furthermore, the exposure apparatus EX exposes the substrate P by projecting the pattern image of the mask M thereon through the projection optical system PL and the liquid LQ of the space SP, in a state wherein the liquid LQ fills a space of the space SP that includes at least the optical path of the exposure light EL.

The present embodiment will now be explained as exemplified by a case of using a scanning-type exposure apparatus (a so-called scanning stepper) as the exposure apparatus EX that exposes the substrate P with the pattern formed on the mask M, while synchronously moving the mask M and the substrate P in the scanning directions (prescribed directions) in mutually different directions (reverse directions). In the following explanation, the directions in which the mask M and the substrate P synchronously move (scanning directions, prescribed directions) within the horizontal plane are the X axial directions, the directions orthogonal to the X axial directions within the horizontal plane are the Y axial directions (non-scanning directions), and the directions perpendicular to the X axial and the Y axial directions and that coincide with an optical axis AX of the projection optical system PL are the Z axial directions. In addition, the rotational (inclined) directions around the X, Y, and Z axes are the θX, θY, and θZ directions, respectively. Furthermore, "substrate" herein includes one in which a semiconductor wafer is coated with a photoresist, and "mask" includes a reticle wherein a device pattern, which is reduction projected onto the substrate, is formed.

The illumination optical system IL illuminates the mask M, which is supported by the mask stage MST, with the exposure light EL, and comprises, for example: an exposure light source; an optical integrator that uniformizes the intensity of the luminous flux emitted from the exposure light source; a condenser lens that condenses the exposure light EL from the optical integrator; a relay lens system; and a variable field stop that sets an illumination region oil the mask M illuminated by the exposure light EL to be slit shaped. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet light (DUV light), such as KrF excimer laser light (248 nm wavelength) and the bright lines (g, h, and i lines) in the ultraviolet region emitted from, for example, a mercury lamp; and vacuum ultraviolet light (VUV light), such as ArF excimer laser light (193 nm wavelength) and F2 laser light (157 nm wavelength). ArF excimer laser light is used in the present embodiment. As discussed above, the liquid LQ in the present embodiment is pure water, and the exposure light EL can transmit therethrough even if it is light from an ArF excimer laser. In addition, the bright lines (g, h, and i lines) of the ultraviolet region as well as deep ultraviolet light (DUV light), such as KrF excimer laser light (248 nm wavelength), can also transmit through pure water.

The mask stage MST holds the mask M and is movable, i.e., two dimensionally movable in the plane perpendicular to the optical axis AX of the projection optical system PL, namely, in the XY plane, and finely rotatable in the θZ direction. A mask stage drive apparatus MSTD, such as a linear motor, drives the mask stage MST. The control apparatus CONT controls the mask stage drive apparatus MSTD. Movable mirrors 40 are provided on the mask stage MST. In addition, a laser interferometer 41 is provided at a position opposing each movable mirror 40. The laser interferometers 41 measure in real time the position in the two dimensional directions and the rotational angle of the mask M on the mask stage MST, and output these measurement results to the control apparatus CONT. The control apparatus CONT drives the mask stage drive apparatus MSTD based on the measurement results of the laser interferometers 41, thereby positioning the mask M, which is supported by the mask stage MST.

The projection optical system PL exposes the substrate P by projecting the pattern of the mask M thereon at a prescribed projection magnification β, and comprises a plurality of optical elements, which includes an optical element (lens) 2 provided at the tip part on the substrate P side, that is supported by a lens barrel PK. In the present embodiment, the projection optical system PL is a reduction system that has a projection magnification β of, for example, ¼ or ⅕. Furthermore, the projection optical system PL may be a unity magnification system or an enlargement system. In addition, the optical element 2 at the tip part of the projection optical system PL of the present embodiment is provided so that it is detachable from (i.e., replaceable) the lens barrel PK. In addition, the optical element 2 at the tip part protrudes from the lens barrel PK and makes contact with the liquid LQ of the immersion area AR2. Thereby, corrosion and the like of the lens barrel PK., which is made of metal, is prevented.

The optical element 2 is made of fluorite. Because fluorite has a high affinity to pure water, the liquid LQ can be made to closely contact substantially the entire surface of a liquid contact surface (end surface) 2A of the optical element 2. Namely, because the liquid LQ (water) supplied in the present embodiment has a high affinity to the liquid contact surface 2A of the optical element 2, the liquid contact surface 2A of the optical element 2 and the liquid LQ have strong adhesion characteristics, and the optical element 2 may therefore be made of quartz, which has a strong affinity to water. In addition, the liquid contact surface 2A of the optical element 2 may be given hydrophilic (lyophilic) treatment in order to further raise its affinity to the liquid LQ.

The substrate stage PST comprises a Z stage 52 that holds the substrate P via the substrate holder PH, and an XY stage 53 that supports the Z stage 52. The XY stage 53 is supported on a base 54. A substrate stage drive apparatus PSTD, such as a linear motor, drives the substrate stage PST. The control apparatus CONT controls the substrate stage drive apparatus PSTD. The Z stage 52 is capable of moving the substrate P, which is held by the substrate holder PH, in the Z axial direction and the θX and θY directions (inclination directions). The XY stage 53 is capable of moving the substrate P, which is held by the substrate holder PH, in the X and Y directions (the directions substantially parallel to the image plane of the projection optical system PL) and in the θZ direction, via the Z stage 52. Furthermore, the Z stage and the XY stage may of course be integrally provided.

A recessed part 55 is provided on the substrate stage PST, and the substrate holder PH is disposed in that recessed part 55. Furthermore, an upper surface 51 of the substrate stage PST, with the exception of the recessed part 55, is formed as a flat surface (flat part) so that it is at substantially the same height as (flush with) the front surface of the substrate P held by the substrate holder PH. Because the upper surface 51, which is substantially flush with the front surface of the substrate P, is provided around the substrate P, it is possible to hold the liquid LQ on the image plane side of the projection optical system PL and thereby satisfactorily form the immersion area AR2, even when performing an immersion exposure of an edge area E of the substrate P. In addition, although there is a gap of approximately 0.1-2 mm between the edge part of the substrate P and the flat surface (upper surface) 51 provided around that substrate P, there is virtually no flow of the liquid LQ into that gap due to the surface tension of the liquid LQ, and the liquid LQ can be held below the projection optical system PL by the flat surface 51 even when exposing the vicinity of the circumferential edge of the substrate P.

Movable mirrors 42 are provided on the substrate stage PST (the Z stage 52). In addition, a laser interferometer 43 is provided at a position opposing each movable mirror 42. The position in the two dimensional directions as well as the rotational angle of the substrate P on the substrate stage PST are measured in real time by the laser interferometers 43, and these measurement results are output to the control apparatus CONT. Based on the measurement results of the laser interferometers 43, the control apparatus CONT drives the XY stage 53 via the substrate stage drive apparatus PSTD within the two dimensional coordinate system defined by the laser interferometers 43, thereby positioning the substrate P, which is supported by the substrate stage PST, in the X and Y axial directions.

In addition, the exposure apparatus EX comprises a focus detection system 30 that detects surface position information of the front surface of the substrate P. The focus detection system 30, which comprises a light emitting part 30A and a light receiving part 30b, detects surface position information of the front surface of the substrate P by projectilg a detection beam La from the light emitting part 30A through the liquid LQ onto the front surface of the substrate P (the exposure surface) from a diagonal direction, and then receiving the light that reflects off of the substrate P and passes through the liquid LQ at the light receiving part 30B. The control apparatus CONT controls the operation of the focus detection system 30 and, based on the light receiving result of the light receiving part 30b, detects the position (the focus position) of the front surface of the substrate P with respect to a prescribed reference surface (image plane) in the Z axial direction. In addition, by deriving a focus position at each of a plurality of points on the front surface of the substrate P, the focus detection system 30 can derive the attitude of the substrate P in an inclination direction. Furthermore, it is possible to use the focus leveling detection system disclosed in, for example, Japanese Published Unexamined Patent Application No. H8-37149 as the constitution of the focus detection system 30.

The control apparatus CONT controls the position of the substrate P, which is supported by the Z stage 52, in the Z axial direction (focus position) and in the θX, θY directions by driving the Z stage 52 of the substrate stage PST via the substrate stage drive apparatus PSTD. Namely, the Z stage 52 operates based on a command, which is based on the detection results of the focus detection system 30, from the control apparatus CONT, controls the focus position (Z position) and the inclination angle of the substrate P, and aligns the surface thereof (exposure surface) with the plane of the image formed through the projection optical system PL and the liquid LQ.

A substrate alignment system 350, which detects alignment marks 1 on the substrate P or a substrate side fiducial mark PFM on a fiducial member 300 provided on the Z stage 52, is provided in the vicinity of the tip of the projection optical system PL. Furthermore, the substrate alignment system 350 of the present embodiment adopts an FIA (field image alignment) system that measures the mark positions by bringing the substrate stage PST to rest, irradiating the marks with the illumination light, such as white light from a halogen lamp, forming the obtained image of the marks within a prescribed image forming field by using an imaging device, and then processing the image, as disclosed in, for example, Japanese Published Unexamined Patent Application No. H4-65603.

In addition, a mask alignment system 360, which is provided in the vicinity of the mask stage MST, detects a mask side fiducial mark MFM on the fiducial member 300, which is provided to the Z stage 52, through the mask M and the projection optical system PL. 20 Furthermore, the mask alignment system 360 of the present embodiment adopts a VRA (visual reticle alignment) system that detects a mark position by irradiating the mark with light and performing image processing of the image data of the mark imaged by, for example, a CCD camera, as disclosed in, for example, Japanese Published Unexamined Patent Application No. H7-176468.

The liquid supply mechanism 10 supplies the prescribed liquid LQ to the space SP, which is between the substrate P and the image plane side tip part of the projection optical system PL, and comprises: a liquid supply part 11 that is capable of feeding the liquid LQ; and supply pipes 13 (13A, 13B), each having one end part that is connected to the liquid supply part 11 and another end part that is connected to liquid supply ports 12 (12A, 12B) of a nozzle member 70, which is discussed later. The supply pipes 13 each have a passage wherethrough the liquid LQ flows. The liquid supply part 11 comprises, for example, a tank, which stores the liquid LQ, and a pressure pump. The control apparatus CONT controls the liquid supply operation of the liquid supply part 11. The liquid supply mechanism 10 supplies the liquid LQ onto the substrate P when forming the immersion area AR2 thereon.

Valves 15A, 15B, which open and close the passages of the supply pipes 13A, 13B, are provided along the supply pipes 13A, 13B, respectively. The control apparatus CONT controls the open/close operation of the valves 15 (15A, 15B). The control apparatus CONT can stop the supply of the liquid by the liquid supply mechanism 10 by closing the passages of the supply pipes 13 via the valves 15. Moreover, the control apparatus CONT can start the supply of the liquid by the liquid supply mechanism 10 by opening the passages of the supply pipes 13 via the valves 15. Furthermore, the valves 15 in the present embodiment are so-called normally closed systems, which mechanically block the passages of the supply pipes 13A, 13B if the drive source (power supply) of the exposure apparatus EX (the control apparatus CONT) stops due to, for example, a power outage.

The timer 60 is connected to the valves 15 (15A, 15B) and is capable of measuring the time during which the valves 15 are open and the time during which they are closed. In addition, the timer 60 can detect whether the valves 15 are closing the passages of the supply pipes 13. If the timer 60 detects that the valves 15 have opened the passages of the supply pipes 13, then it starts measuring the time. In addition, the timer 60 also starts measuring the time if it detects that the valves 15 have closed the passages of the supply pipes 13.

The timer 60 can measure the time that has elapsed since the valves 15 opened the passages of the supply pipes 13, i.e., since the supply of the liquid was started by the liquid supply mechanism 10. The information related to the elapsed time measured by the timer 60 is output to the control apparatus CONT. In addition, the timer 60 stops timing operation and resets the measurement time (returns the value to zero) if it detects that the valves 15 have closed the passages of the supply pipes 13.

In addition, the timer 60 can measure the time that has elapsed since the valves 15 closed the passages of the supply pipes 13, i.e., since the supply of the liquid by the liquid supply mechanism 10 was stopped. The information related to the elapsed time measured by the timer 60 is output to the control apparatus CONT. In addition, the timer 60 stops timing operation and resets the measurement time (returns the value to zero) if it detects that the valves 15 have opened the passages of the supply pipes 13.

The liquid recovery mechanism 20 recovers the liquid LQ on the image plane side of the projection optical system PL, and comprises: a liquid recovery part 21 that is capable of recovering the liquid LQ; and recovery pipes 23 (23A, 23B), each having one end part that is connected to the liquid recovery part 21 and another end part that is connected to recovery ports 22 (22A, 22B) of the nozzle member 70, which is discussed later. The liquid recovery part 21 is provided with, for example: a vacuum system (a suction apparatus), e.g., a vacuum pump and the like; a gas-liquid separator that separates the recovered liquid LQ and gas; and a tank that stores the recovered liquid LQ. Furthermore, instead of providing the exposure apparatus EX with a vacuum pump, the vacuum system at the plant where the exposure apparatus EX is disposed may be used as the vacuum system. The control apparatus CONT controls the liquid recovery operation of the liquid recovery part 21. To form the immersion area AR2 on the substrate P, the liquid recovery mechanism 20 recovers a prescribed amount of the liquid LQ, which was supplied by the liquid supply mechanism 10, on the substrate P.

Valves 25A, 25B, which open and close the passages of the recovery pipes 23A, 23B, are provided along the recovery pipes 23A, 23B, respectively. The control apparatus CONT controls the open/close operation of the valves 25 (25A, 25B). The control apparatus CONT can stop the recovery of the liquid by the liquid recovery mechanism 20 by closing the passages of the recovery pipes 23 via the valves 25. Moreover, the control apparatus CONT can start the recovery of the liquid by the liquid recovery mechanism 20 by opening the passages of the recovery pipes 23 via the valves 25.

The nozzle member 70 is disposed in the vicinity of the optical element 2 of the plurality of optical elements, which constitute the projection optical system PL, that contacts the liquid LQ. The nozzle member 70 is an annular member provided above the substrate P (above the substrate stage PST) so that it surrounds the side surface of the optical element 2. A gap is provided between the optical element 2 and the nozzle member 70, which is supported by a prescribed support mechanism so that it is vibrationally isolated from the optical element 2.

The nozzle member 70 is provided above the substrate P (the substrate stage PST), and comprises the liquid supply ports 12 (12A, 12B), which are disposed so that they oppose the front surface of the substrate P. In the present embodiment, the nozzle member 70 has two liquid supply ports 12A, 12B. The liquid supply ports 12A, 12B are provided to a lower surface 70A of the nozzle member 70.

In addition, the interior of the nozzle member 70 comprises supply passages that correspond in number to the liquid supply ports 12A, 12B. In addition, the plurality (two) of supply pipes 13A, 13B is provided so that they correspond in number to the liquid supply ports 12A, 12B and the supply passages. Furthermore, one end part of each of the supply passages is connected to the liquid supply part 11 via the supply pipes 13A, 13B, respectively, and the other end part of each is connected to the liquid supply ports 12A, 12B, respectively.

In addition, first flow meters 16 (16A, 16B), which measure the flow per unit of time of the liquid LQ that is fed from the liquid supply part 11 and flows through each of the passages of the supply pipes 13A, 13B, are provided along the two supply pipes 13A, 13B, respectively. By measuring the amount of flow of the liquid LQ that flows through each of the supply pipes 13, the first flow meters 16 can measure the amount of the liquid supplied per unit of time by the liquid supply mechanism 10. The measurement result of the first flow meters 16 is output to the control apparatus CONT.

In addition, the control apparatus CONT can determine, based on the measurement result of the first flow meters 16, whether the liquid supply mechanism 10 is supplying the liquid via the supply pipes 13. In other words, if the control apparatus CONT determines, based on the measurement result of the first flow meters 16, that the liquid LQ is not flowing in the passages of the supply pipes 13, then it can determine that the supply of the liquid by the liquid supply mechanism 10 is stopped. Moreover, if the control apparatus CONT determines, based on the measurement result of the first flow meters 16, that the liquid LQ is flowing in the passages of the supply pipes 13, then it can determine that the liquid is being supplied by the liquid supply mechanism 10.

In addition, although not shown, flow controllers, which are called mass flow controllers and control the amount of liquid fed per unit of time from the liquid supply part II to each of the liquid supply ports 12A, 12B, are provided along the two supply pipes 13A, 13B, respectively. The flow controllers control the amount of the liquid based on a command signal from the control apparatus CONT.

Furthermore, the nozzle member 70 is provided above the substrate P (the substrate stage PST), and comprises the liquid recovery ports 22 (22A, 22B), which are disposed so that they oppose the front surface of the substrate P. In the present embodiment, the nozzle member 70 comprises two liquid recovery ports 22A, 22B. The liquid recovery ports 22A, 22B are provided to the lower surface 70A of the nozzle member 70.

In addition, the interior of the nozzle member 70 comprises recovery passages that correspond in number to the liquid recovery ports 22A, 22B. In addition, the plurality (two) of the recovery pipes 23A, 23B is provided so that they correspond in number to the liquid recovery ports 22A, 22B and the recovery passages. Furthermore, one end part of each of the recovery passages is connected to the liquid recovery part 21 via the recovery pipes 23A, 23B, respectively, and the other end part of each is connected to the liquid recovery ports 22A, 22B, respectively.

In addition, second flow meters 26 (26A, 26B), which measure the flow per unit of time of the liquid LQ that was recovered from the image plane side of the projection optical system PL through the liquid recovery ports 22A, 22B and that flows through each of the passages of the recovery pipes 23A, 23B, are provided along the two recovery pipes 23A, 23B, respectively. By measuring the amount of flow of the liquid LQ that flows through each of the recovery pipes 23, the second flow meters 26 can measure the amount of the liquid recovered per unit of time by the liquid recovery mechanism 20. The measurement result of the second flow meters 26 is output to the control apparatus CONT.

In addition, the control apparatus CONT can determine, based on the measurement result of the second flow meters 26, whether the liquid recovery mechanism 20 is recovering the liquid via the recovery pipes 23. In other words, if the control apparatus CONT determines, based on the measurement result of the second flow meters 26, that the liquid LQ is not flowing in each of the passages of the recovery pipes 23, then it can determine that the recovery of the liquid by the liquid recovery mechanism 20 is stopped. Moreover, if the control apparatus CONT determines, based on the measurement result of the second flow meters 26, that the liquid LQ is flowing in each of the passages of the recovery pipes 23, then it determines that the liquid is being recovered by the liquid recovery mechanism 20.

In the present embodiment, the nozzle member 70 constitutes a part of both the liquid supply mechanism 10 and the liquid recovery mechanism 20. Furthermore, the liquid supply port 12A and the liquid supply port 12B, which constitute the liquid supply mechanism 10, are respectively provided at positions on opposite sides of the projection area AR1 of the projection optical system PL in the X axial direction so that the projection area AR1 is interposed therebetween, and the liquid recovery port 22A and the liquid recovery port 22B, which constitute the liquid recovery mechanism 20, are respectively provided on the outer sides of the liquid supply ports 12A, 12B of the liquid supply mechanism 10 with respect to the projection area AR1 of the projection optical system PL. Furthermore, the projection area AR1 of the projection optical system PL in the present embodiment is set to a rectangular shape in a plan view, wherein the longitudinal direction is the Y axial direction and the latitudinal direction is the X axial direction.

The control apparatus CONT controls the operation of the liquid supply part 11 and the abovementioned flow controllers. When supplying the liquid LQ onto the substrate P, the control apparatus CONT feeds the liquid LQ from the liquid supply part 11 and supplies the liquid LQ onto the substrate P from the liquid supply ports 12A, 12B, which are provided above the substrate P, through the supply pipes 13A, 13B and the supply passages. At this time, the liquid supply port 12A and the liquid supply port 12B are respectively disposed on opposite sides of the projection area AR1 of the projection optical system PL so that the projection area AR1 is interposed therebetween, and therefore the liquid LQ can be supplied from both sides of the projection area AR1 through those liquid supply ports 12A, 12B. In addition, the amounts of the liquid LQ supplied per unit of time onto the substrate P from the liquid supply ports 12A, 12B can be separately controlled by the flow controllers, which are provided to the supply pipes 13A, 13B, respectively.

The control apparatus CONT controls the liquid recovery operation of the liquid recovery part 21. The control apparatus CONT can control the amount of the liquid recovered per unit of time by the liquid recovery part 21. The liquid LQ on the substrate P recovered via the liquid recovery ports 22A, 22B, which are provided above the substrate P, is recovered by the liquid recovery part 21 through the recovery passages of the nozzle member 70 and the recovery pipes 23A, 23B.

Furthermore, in the present embodiment, the supply pipes 13A, 13B are connected to one liquid supply part 11, but a plurality (herein, two) of liquid supply parts 11 that correspond to the number of the supply pipes may be provided, and the supply pipes 13A, 13B may be connected to this plurality of liquid supply parts 11, respectively. In addition, the recovery pipes 23A, 23B are connected to one liquid recovery part 21, but a plurality (herein, two) of liquid recovery parts 21 that correspond to the number of recovery pipes may be provided, and the recovery pipes 23A, 23B may be connected to this plurality of liquid recovery parts 21, respectively.

In addition, it is also acceptable to have just one supply pipe 13 and to provide a valve 15 and a flow meter 16 therealong. Furthermore, if there is just one supply pipe 13, then one end part thereof may be connected to the liquid supply part 11, and the other end part may be branched midway and connected to the liquid supply ports 12A, 12B.

The liquid contact surface 2A of the optical element 2 of the projection optical system PL and the lower surface (liquid contact surface) 70A of the nozzle member 70 are lyophilic (hydrophilic). In the present embodiment, the optical element 2 and the liquid contact surface of the nozzle member 70 are lyophilically treated, which makes them lyophilic. In other words, at least the liquid contact surfaces of the surfaces of the members that oppose the surface to be exposed (front surface) of the substrate P, which is held by the substrate stage PST, is lyophilic. Because the liquid LQ in the present embodiment is water, which has a high polarity, the liquid contact surfaces of the optical element 2 and of the nozzle member 70 can be lyophilically treated (hydrophilically treated) in order to impart lyophilicity by, for example, forming a thin film with a substance that has a molecular structure that has a high polarity, such as alcohol. Namely, if using water as the liquid LQ, then it is preferable to use a process that provides the liquid contact surfaces with a thin film that has a molecular structure that has a high polarity, such as the OH group. Alternatively, the liquid contact surfaces may be provided with a lyophilic material, such as $MgF_2$, $Al_2O_3$, or $SiO_2$.

The lower surface (surface facing the substrate P side) 70A of the nozzle member 70 is substantially a flat surface, the lower surface (liquid contact surface) 2A of the optical element 2 is also a flat surface, and the lower surface 70A of the nozzle member 70 is substantially flush with the lower surface 2A of the optical element 2. Thereby, the immersion area AR2 can be satisfactorily formed over a large area.

In addition, the upper surface 51 of the substrate stage PST forms a flat surface (flat part) that is given a liquid repellant treatment and is therefore liquid repellant. Examples of liquid repellent treatments for the upper surface 51 include coating it with a liquid repellent material, e.g., a fluororesin material or an acrylic resin material, as well as affixing a thin film made of the abovementioned liquid repellent material. A material that is insoluble in the liquid LQ is used as the liquid repellent material for imparting liquid repellency. Furthermore, all or part of the substrate stage PST, which includes the upper surface 51, may be made of a liquid repellent material, such as a fluororesin like, for example, polytetrafluoroethylene (Teflon™).

Figure 2:
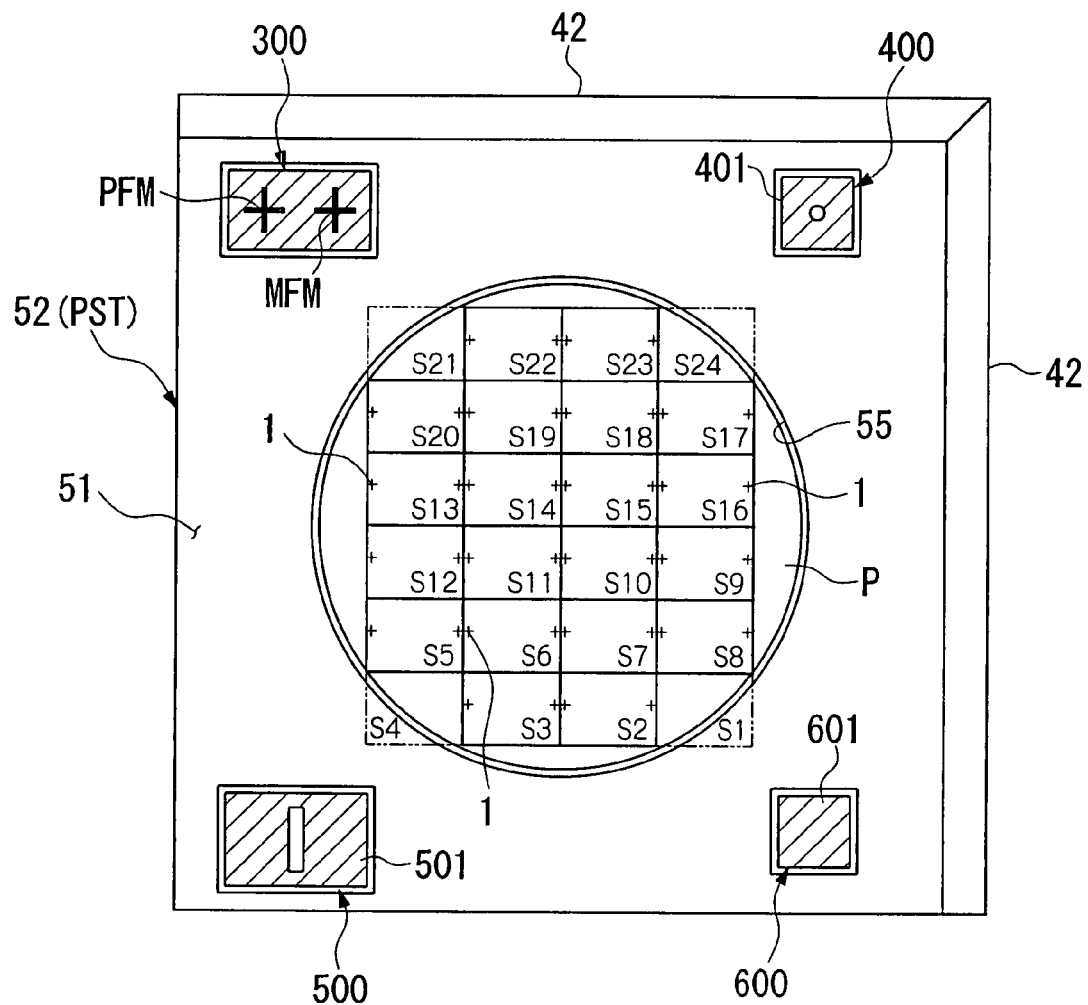
FIG. 2 is a plan view of a substrate stage, viewed from above.

FIG. 2 is a plan view of the Z stage 52 (substrate stage PST), viewed from above. The fiducial member 300 is disposed on the substrate stage PST at a prescribed position on the outer side of the substrate P. The fiducial mark PFM, which is detected by the substrate alignment system 350 through the liquid LQ, and the fiducial mark MFM, which is detected by the mask alignment system 360 through the liquid LQ, are provided to the fiducial member 300 with a prescribed positional relationship. An upper surface of the fiducial member 300 is substantially a flat surface (flat part) and is provided at substantially the same height as (flush with) the front surface of the substrate P, which is held by the substrate stage PST, and the upper surface 51 of the substrate stage PST. The upper surface of the fiducial member 300 can also serve as the reference of the focus detection system 30. In addition, the substrate alignment system 350 also detects each alignment mark 1, which is formed attendant with each of the shot regions S1-S24 on the substrate P.

In addition, a luminous flux intensity nonuniformity sensor 400 of the type disclosed in, for example, Japanese Published Patent Application No. S57-117238 is disposed as a measurement sensor on the substrate stage PST at a prescribed position on the outer side of the substrate P. The luminous flux intensity nonuniformity sensor 400 comprises an upper plate 401 that has a flat surface (flat part) provided at substantially the same height as (flush with) the front surface of the substrate P, which is held by the substrate stage PST, and the upper surface 51 of the substrate stage PST. In addition, a light receiving device (detector), which constitutes the luminous flux intensity nonuniformity sensor 400, is embedded inside the substrate stage PST (under the upper plate), and receives the exposure light EL through the liquid LQ of the immersion area formed on the upper plate 401.

Likewise, an aerial image measuring sensor 500 of the type disclosed in, for example, Japanese Published Patent Application No. 2002-14005 is provided as a measurement sensor on the substrate stage PST at a prescribed position on the outer side of the substrate P. The aerial image measuring sensor 500 also has an upper plate 501 that has a flat surface (flat part) provided at substantially the same height as (flush with) the front surface of the substrate P, which is held by the substrate stage PST, and the upper surface 51 of the substrate stage PST. In addition, an irradiance sensor (luminous flux intensity sensor) 600, as disclosed in, for example, Japanese Published Patent Application No. H11-16816, is also provided on the substrate stage PST, and an upper surface of an upper plate 601 of that irradiance sensor 600 is provided at substantially the same height as (flush with) the front surface of the substrate P, which is held by the substrate stage PST, and the upper surface 51 of the substrate stage PST. Furthermore, both of the measurement sensors discussed above perform various measurements by receiving light through the liquid LQ of the immersion area formed on the upper plate of the sensors.

Figure 3:
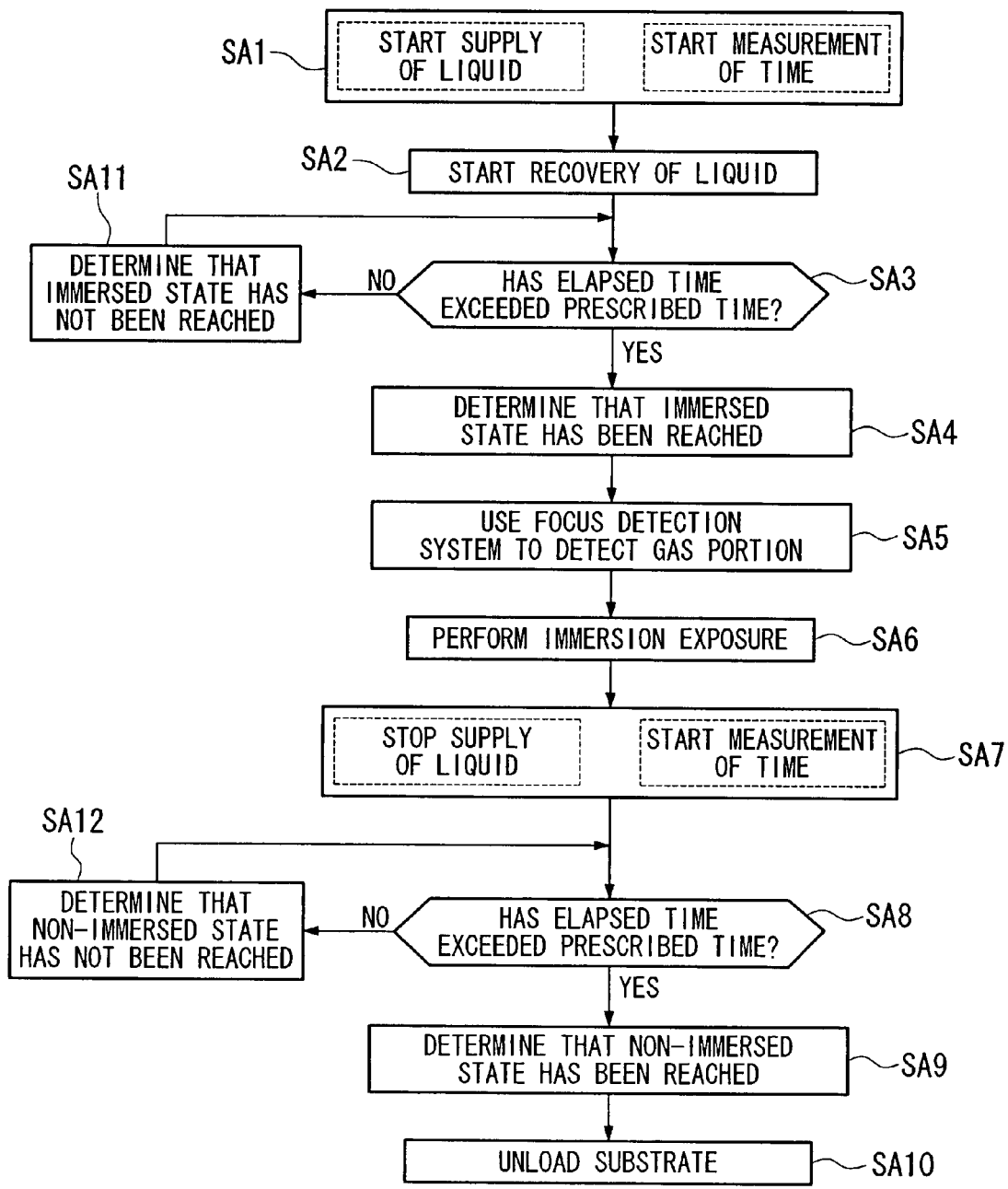
FIG. 3 is a flow chart diagram that depicts one embodiment of an exposing method according to the present invention.

The following explains a method of using the exposure apparatus EX that has the constitution discussed above to expose the substrate P with the pattern image of the mask M, referencing the flow chart diagram in FIG. 3.

Before starting the exposure of the substrate P, it is assumed that the positional relationship (baseline quantity) between the detection reference position of the substrate alignment system 350 and the projection position of the pattern image of the mask M has already been measured using, for example, the substrate alignment system 350, the mask alignment system 360, and the fiducial member 300. In addition, it is also assumed that the measurements by the various sensors installed on the substrate stage PST have been completed and that corrective measures have already been taken based on those measurement results.

First, the substrate P, which is the target to be exposure processed, is loaded onto the substrate stage PST by a conveyor system (loading apparatus). Next, to superposingly expose the substrate P, the control apparatus CONT uses the substrate alignment system 350 to measure each of the alignment marks 1, which are formed attendant with each of the shot regions on the substrate P. The laser interferometers 43 measure the position of the substrate stage PST when the substrate alignment system 350 is measuring each of the alignment marks 1. The control apparatus CONT measures each of the alignment marks 1 in a state (non-immersed state) wherein the immersion area of the liquid LQ is not formed on the substrate P. The control apparatus CONT aligns the projection position of the pattern image of the mask M and a shot region by deriving, based on the detection results of each alignment mark 1, the positional information of that shot region with respect to the detection reference position of the substrate alignment system 350, and then moving the substrate stage PST based on that positional information and the previously measured baseline quantity.

When loading the abovementioned substrate P or while measuring each alignment mark 1, the control apparatus CONT closes the passages of the supply pipes 13 of the liquid supply mechanism 10 by driving the valves 15.

Next, the control apparatus CONT outputs a command signal to start the immersion exposure. The control apparatus CONT opens the passages of the supply pipes 13 by driving the valves 15 in a state wherein the optical element 2 of the projection optical system PL and a prescribed region on the substrate stage PST that includes the substrate P are opposing, and starts the supply of the liquid by the liquid supply mechanism 10. The timer 60 detects that the passages of the supply pipes 13 have opened, resets the measurement time (returns the value to zero), and starts measuring the time (step SA1).

Namely, the timer 60 detects that the valves 15 have opened the passages of the supply pipes 13, and uses that point in time as a reference to measure the time that the passages of the supply pipes 13 are open, i.e., measures the time that has elapsed since the liquid supply mechanism 10 started the supply of the liquid. The measurement result of the timer 60 is output to the control apparatus CONT, which monitors such.

In addition, the control apparatus CONT starts the recovery of the liquid LQ by the liquid recovery mechanism 20 substantially simultaneous to the start of the supply of the liquid LQ by the liquid supply mechanism 10 (step SA2). At this time, the amount of the liquid supplied per unit of time by the liquid supply mechanism 10 and the amount of the liquid recovered per unit of time by the liquid recovery mechanism 20 are substantially fixed values.

Furthermore, the liquid recovery operation (suction operation) by the liquid recovery mechanism 20 can be performed prior to starting the supply of the liquid LQ by the liquid supply mechanism 10 (even in a state wherein the supply of the liquid LQ is stopped).

Furthermore, the operation of forming the immersion area AR2 before exposing the substrate P is preferably performed at a specific position on the substrate stage PST in accordance with the operation following the formation of the immersion area AR2, but may be formed at a position wherein the optical element 2 of the projection optical system PL and the substrate P are opposing, or at a position wherein the optical element 2 of the projection optical system PL and, for example, the upper surface 51 of the substrate stage PST are opposing. For example, the immersion area AR2 may be formed at an exposure start position of a first exposure area on the substrate P, or at a position opposing the fiducial member 300, which is suitable for detecting a gas portion in the immersion area (step SA5; discussed in detail later). When the immersion area AR2 is formed on the upper surface 51 by supplying and recovering the liquid LQ at a position whereat the optical element 2 and the upper surface 51 are opposing, the immersion area AR2 on the substrate P should be moved by moving the substrate stage PST in the X and Y directions when immersion exposing the substrate P.

Based on the measurement result of the timer 60, the control apparatus CONT determines whether the time that has elapsed since the supply of the liquid LQ was started by the liquid supply mechanism 10 exceeds a prescribed time (step SA3).

At this point, the prescribed time is the time from when the supply of the liquid LQ by liquid supply mechanism 10 is started until the time when the space SP between the optical element 2 of the projection optical system PL and the front surface of the substrate P (or the substrate stage PST) is filled with the liquid LQ, and is derived in advance by, for example, experimentation or simulation. In addition, there are cases wherein, immediately after the space SP is filled with the liquid LQ, a so-called microbubble with a diameter of less than 100 μm remains. Consequently, the prescribed time may be set to a time to which is added the standby time need for this microbubble to disappear. Furthermore, the information related to this prescribed time is stored in the storage apparatus MRY.

The present invention is constituted so that the liquid LQ that is fed from the liquid supply part 11 of the liquid supply mechanism 10 flows through the supply pipes 13, is supplied to the space SP from the liquid supply ports 12, and fills the space SP. Accordingly, after the liquid supply part 11 starts the supply of the liquid LQ, the prescribed time is needed until the space SP is filled with the liquid LQ. Furthermore, the prescribed time changes in accordance with, for example, the flow of the liquid per unit of time (amount supplied), the volume of the supply passages, which include the supply pipes 13 and the liquid supply ports 12, and the volume of the space SP (the volume of the immersion area AR2). Accordingly, by deriving the information related to the abovementioned prescribed time in advance by, for example, experimentation and simulation, the control apparatus CONT can determine whether the space SP is filled with the liquid LQ based on the prescribed time and the measurement result of the timer 60.

If the control apparatus CONT determines that the elapsed time has reached the prescribed time, then it determines that the space SP, which is between the optical element 2 of the projection optical system PL and the front surface of the substrate P (or the substrate stage PST), is filled with the liquid LQ and has reached the immersed state (step SA4). The amount of the liquid supplied per unit of time by the liquid supply mechanism 10 and the amount of the liquid recovered per unit of time by the liquid recovery mechanism 20 are substantially fixed, and the control apparatus CONT therefore can determine whether the space SP has reached the immersed state based on the previously derived prescribed time and on the elapsed time, which is the measurement result of the timer 60.

Moreover, if the control apparatus CONT determines that the elapsed time has not reached the prescribed time, then it determines that the space SP has not yet reached the immersed state (step SA11). Furthermore, the supply and recovery of the liquid LQ by the liquid supply mechanism 10 and the liquid recovery mechanism 20 continue until the elapsed time reaches the prescribed time.

Furthermore, at this point, the present invention is constituted so that the control apparatus CONT monitors the timer 60 and determines whether the time that has elapsed since the supply of the liquid LQ was started exceeds the prescribed time, which is stored in the storage apparatus MRY, based on the measurement result of the timer 60, but may be constituted so that the information related to the prescribed time is stored in the timer 60, and, when the elapsed time exceeds the prescribed time, the timer 60 outputs a signal to the control apparatus CONT indicating that the elapsed time has exceeded the prescribed time.

After the control apparatus CONT determines that the space SP is filled with the liquid LQ and has reached the immersed state, it uses the focus detection system 30 to detect a gas portion in the liquid LQ that fills the space SP (step SA5).

At this time, the gas portion may include, for example, a bubble that is floating in the liquid LQ, or a bubble that is adhered to the substrate P (substrate stage PST). Alternatively, the gas portion may include a gas portion that is generated due to the fact that the liquid LQ of the immersion area AR2 does not form a tight seal with, for example, the front surface of the substrate P (substrate stage PST) and the end surface of the optical element 2 as a result of, for example, the separation of the liquid LQ attendant with the movement of the substrate P, or an operational failure of the liquid supply mechanism 10.

When using the focus detection system 30 to detect a gas portion, the control apparatus CONT projects a detection beam La from the light projecting part 30A to the space SP. If there is, for example, a bubble in the liquid LQ of the space SP, then the detection beam La that strikes the bubble will, for example, scatter and refract. Accordingly, the detection beam La that strikes the bubble will be received by the light receiving part 30B in a state wherein the light quantity is reduced, or its optical path will be changed and its light will consequently not be received by the light receiving part 30B. In other words, if there is a bubble (gas portion) in the liquid LQ, then the intensity of the light received by the light receiving part 30B will change (decrease). Accordingly, the focus detection system 30 can optically detect a bubble (gas portion) present in the liquid LQ disposed in the space SP, based on the output of the light receiving part 30B.

Furthermore, a gas portion in the liquid LQ may be detected using a dedicated detection system instead of the focus detection system 30. For example, the present invention may be constituted so that a laser beam is irradiated substantially parallel to the front surface of the substrate P from a prescribed irradiating part to the liquid LQ of the space SP, a light receiving part, which is disposed with a prescribed positional relationship with respect to the laser beam, receives the light of the laser beam through the liquid LQ, and a gas portion is optically detected based on the light receiving result. If there is a gas portion, then the irradiated laser beam, for example, scatters, which changes the intensity of the light received by the light receiving part and therefore makes it possible to optically detect a gas portion.

The control apparatus CONT determines that the space SP is filled with the liquid LQ based on the measurement result of the timer 60, verifies that there is no gas portion (bubble) in the liquid LQ of the space SP based on the detection result of the focus detection system 30, and then positions the optical element 2 of the projection optical system PL and the substrate P so that they are opposing. Furthermore, while continuing to supply and recover the liquid LQ via the liquid supply mechanism 10 and the liquid recovery mechanism 20, the control apparatus CONT irradiates the exposure light EL while moving the substrate stage PST, which supports the substrate P, in the X axial direction (scanning direction), and exposes the substrate P by projecting the pattern image of the mask M thereon through the projection optical system PL and the liquid LQ of the space SP (step SA6).

The exposure apparatus EX of the present embodiment exposes the substrate P by projecting the pattern image of the mask M thereon while moving the mask M and the substrate P in the X axial directions (the scanning directions); during scanning exposure, the pattern image of one part of the mask M is projected within the projection area AR1 through the projection optical system PL and the liquid LQ of the immersion area AR2, and, synchronized to the movement of the mask M at a velocity V in the −X direction (or the +X direction), the substrate P moves at a speed β·V (where P is the projection magnification) in the +X direction (or the −X direction) with respect to the projection area AR1. A plurality of shot regions are set up on the substrate P; after the exposure of one shot region is completed, the next shot region moves to the scanning start position by the stepping movement of the substrate P; subsequently, the scanning exposure process is performed sequentially for each shot region by the step-and-scan system, while moving the substrate P.

After the immersion exposure of the substrate P ends, the control apparatus CONT closes the passages of the supply pipes 13 by driving the valves 15, and stops the supply of the liquid LQ by the liquid supply mechanism 10. The timer 60 detects that the passages of the supply pipes 13 are closed, resets the measurement time (returns the value to zero), and starts measuring the time (step SA7).

Namely, the timer 60 detects that the valves 15 have closed the passages of the supply pipes 13, and uses that point in time as a reference to measure the time that the passages of the supply pipes 13 are closed, i.e., measures the time that has elapsed since the supply of the liquid by the liquid supply mechanism 10 was stopped. The measurement result of the timer 60 is output to the control apparatus CONT, which monitors such.

At this time, even after the supply of the liquid LQ by the liquid supply mechanism 10 stops, the control apparatus CONT recovers the liquid LQ using the liquid recovery mechanism 20 for just the prescribed time. When recovering the liquid LQ, the control apparatus CONT recovers the liquid LQ remaining on, for example, the substrate P and the substrate stage PST (upper surface 51) while moving the substrate stage PST in the X and Y directions relative to the liquid recovery ports 22 of the liquid recovery mechanism 20. Thereby, it is possible to recover the liquid LQ remaining over a large area of the substrate P and the substrate stage PST. Furthermore, when recovering the liquid LQ on, for example, the substrate P and the substrate stage PST, the control apparatus CONT may do so in a state wherein the substrate P (substrate stage PST) and the recovery ports 22 are brought close together by moving the substrate stage PST in the Z axial direction.

Based on the measurement result of the timer 60, the control apparatus CONT determines whether the time that has elapsed since the supply of the liquid LQ by the liquid supply mechanism 10 was stopped exceeds a prescribed time (step SA8).

At this point, the prescribed time is the time from when the supply of the liquid LQ by the liquid supply mechanism 10 was stopped until the tine when the liquid LQ that filled the space SP, which is between the optical element 2 of the projection optical system PL and the front surface of the substrate P (or the substrate stage PST), is recovered, and is derived in advance by, for example, experimentation or simulation. Furthermore, the information related to this prescribed time is stored in the storage apparatus MRY.

If the control apparatus CONT determines that the elapsed time has reached the prescribed time, then it determines that the recovery of the liquid LQ that filled the space SP, which is between the optical element 2 of the projection optical system PL and the front surface of the substrate P (or the substrate stage PST), is complete and that the space SP has reached the non-immersed state (step SA9).

Moreover, if the control apparatus CONT determines that the elapsed time has not reached the prescribed time, then it determines that the space SP has not yet reached the non-immersed state (step SA12). Furthermore, the recovery of the liquid LQ by the liquid recovery mechanism 20 continues until the elapsed time reaches the prescribed time.

Furthermore, even in this case, the present invention may be constituted so that the information related to the prescribed time is stored in the timer 60, and, when the elapsed time exceeds the prescribed time, the timer 60 outputs a signal to the control apparatus CONT indicating that the elapsed time has exceeded the prescribed time.

After the control apparatus CONT determines that the recovery of the liquid LQ on the substrate P and the substrate stage PST is complete and the non-immersed state has been reached, it moves the substrate stage PST to an unload position, which is a position spaced apart from the projection optical system PL. Furthermore, the substrate P, for which exposure has finished, on the substrate stage PST is unloaded by the conveyor system (unloading apparatus) at the unload position (step SA10).

Furthermore, the embodiment explained referencing FIG. 3 was explained taking as an example a case wherein the liquid LQ is disposed on, for example, the substrate P and the upper surface 51 when immersion exposing the substrate P, but the present invention can also be adapted to a case wherein the measurement process is performed in a state wherein the liquid LQ is disposed on a prescribed flat part of the substrate stage PST, such as the measuring member 300 and the measuring sensors 400, 500, 600. If the liquid LQ is disposed on, for example, the measuring sensor 400 and the measurement process is performed, then the liquid LQ is supplied and recovered by the liquid supply mechanism 10 and the liquid recovery mechanism 20 in a state wherein the optical element 2 of the projection optical system PL and the upper plate 401 of the measuring sensor 400 are opposing. Furthermore, when the control apparatus CONT determines whether the space between the optical element 2 and the upper plate 401 is filled with the liquid LQ, it can make this determination based on the measurement result of the timer 60. In addition, if recovering the liquid after the measurement process has ended, then the control apparatus CONT can determine whether the liquid LQ has been recovered based on the measurement result of the timer 60.

As explained above, it is possible to determine whether the space SP, which is between the projection optical system PL and the substrate P, is filled with the liquid LQ based on the time that has elapsed since the supply of the liquid was started. Accordingly, it can be easily determined, with a comparatively simple constitution, whether the space SP is filled with the liquid LQ without newly constructing a system for detecting such. Furthermore, because the exposure process and the measurement process can be performed through the liquid LQ after the space SP is filled with such, exposure and measurement accuracies can be maintained.

In addition, it is also possible to determine whether the liquid LQ has been recovered from the space SP, which is between the projection optical system PL and the substrate P, based on the time that has elapsed since the supply of the liquid was stopped. Accordingly, it is possible to easily determine, with a comparatively simple constitution, whether the liquid LQ has been recovered without newly constructing a system for detecting the liquid LQ in the space SP. Furthermore, it is possible to perform a predetermined process, such as unloading the substrate P after recovering the liquid LQ, or measuring without going through the liquid LQ, and it is therefore possible to prevent the occurrence of problems, such as the scattering of the liquid LQ, and to maintain exposure and measurement accuracies.

Furthermore, in the embodiment discussed above, the starting and stopping of the supply of the liquid by the liquid supply mechanism 10 is determined based on the operation of the valves 15, but can also be determined based on the measurement result of the first flow meters 16, as discussed above. Accordingly, when starting or stopping the supply of the liquid by the liquid supply mechanism 10, the control apparatus CONT may start the measurement of the time by the timer 60 based on the measurement result of the first flow meters 16.

In addition, the measurement of time beginning when the supply of the liquid is started may be initiated by using the point in time when the amount of flow, which is measured by the first flow meters 16 that are provided to the supply pipes 13, exceeds a prescribed amount as a reference. Likewise, the measurement of time beginning when the supply of the liquid stops may be initiated using the point in time when the amount of flow, which is measured by the first flow meters 16 that are provided to the supply pipes 13, falls below a prescribed amount as a reference.

In addition, a sensor may be installed that detects the presence of the liquid on the image plane side of the optical element 2 of the projection optical system PL, and the measurement of time by the timer 60 may be started based on the detection result of that sensor. For example, the measurement of the time beginning when the supply of the liquid LQ was started can be initiated using the point in time when the sensor detects the presence of the liquid LQ as a reference. In addition, the measurement of time beginning when the supply of the liquid stopped can be initiated using the point in time when the sensor detects the absence of the liquid LQ as a reference. The focus detection system 30 can be used as such a sensor. If the detection beam (reflected light) of the focus detection system 30 passes through the image plane side of the projection optical system PL and the liquid LQ has unfortunately depleted on the image plane side of the projection optical system PL, i.e., in the optical path of the detection beam (reflected light), then a detection error will occur in the focus detection system 30; consequently, it is possible to detect the presence of the liquid on the image plane side of the optical element 2 of the projection optical system PL by monitoring that detection error.

In addition, a plurality of configurations of the type discussed above for detecting, for example, that the supply of the liquid by the liquid supply mechanism 10 has started or stopped, or whether the space SP is in the immersed state may be prepared in advance, and the measurement of time by the timer 60 may be started by appropriately combining these configurations.

Figure 4:
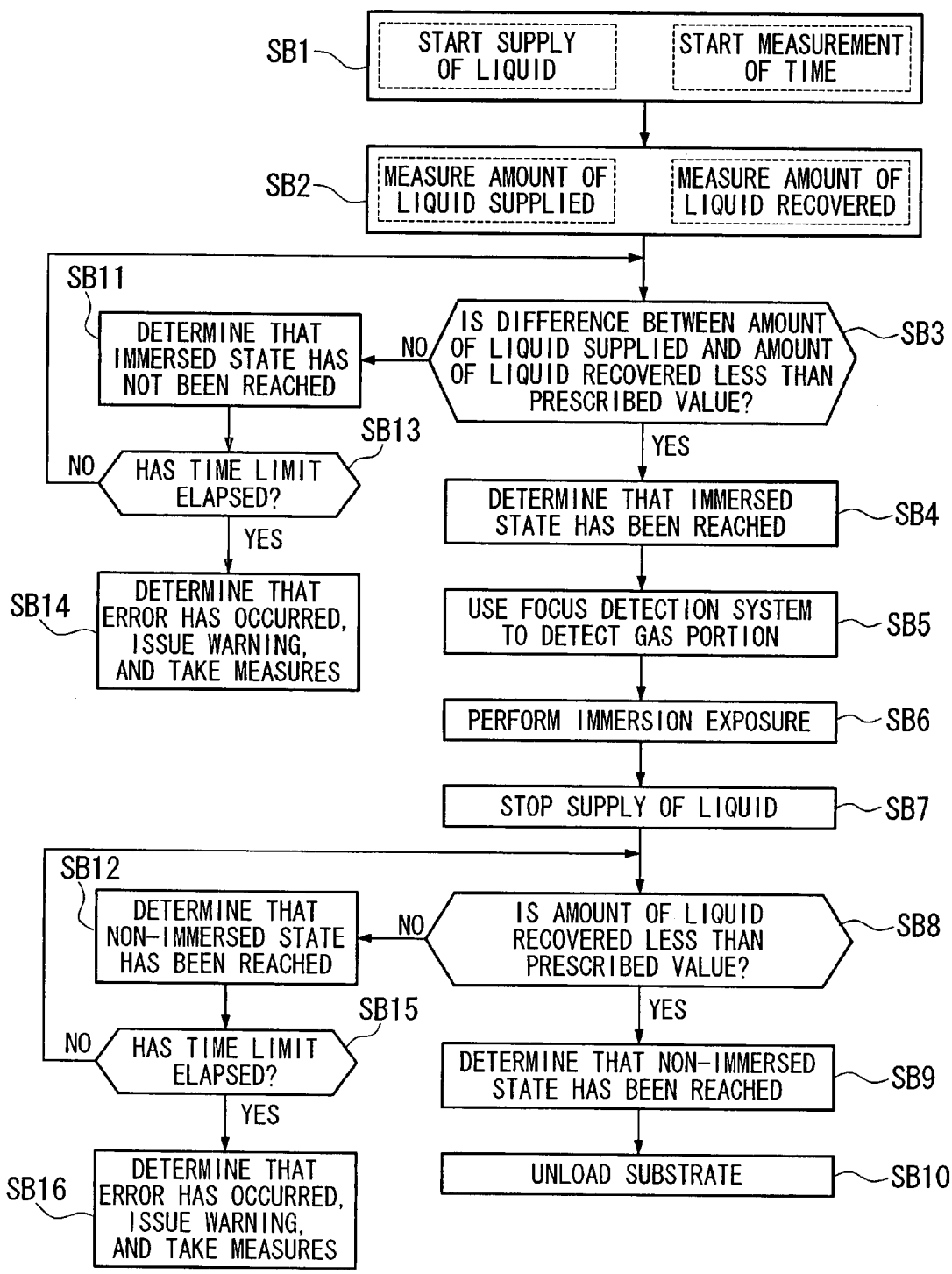
FIG. 4 is a flow chart diagram that depicts another embodiment of an exposing method according to the present invention.

The following explains another embodiment of the present invention, referencing the flow chart diagram in FIG. 4. In the explanation below, components that are identical or equivalent to those in the embodiment discussed above are assigned identical symbols, and the explanations thereof are abbreviated or omitted.

After the substrate P is loaded on the substrate stage PST, the control apparatus CONT opens the passages of the supply pipes 13 by driving the valves 15 in a state wherein the optical element 2 of the projection optical system PL and the prescribed region on the substrate stage PST, including the substrate P, are opposing, and starts the supply of the liquid by the liquid supply mechanism 10. In addition, the control apparatus CONT starts the recovery of the liquid by the liquid recovery mechanism 20 substantially simultaneous with the start of the supply of the liquid by the liquid supply mechanism 10 (step SB1).

Simultaneous with the start of the supply and the recovery of the liquid LQ by the liquid supply mechanism 10 and the liquid recovery mechanism 20 (or after the elapse of a prescribed time), the control apparatus CONT starts the measurement of the amount of the liquid supplied per unit of time, as well as the amount of the liquid recovered per unit of time using the first flow meters 16 and the second flow meters 26 (step SB2).

The measurement results of the first flow meters 16 and the second flow meters 26 are output to the control apparatus CONT. Based on the measurement results of the first flow meters 16 and the second flow meters 26, the control apparatus CONT determines whether the difference between the amount of liquid supplied and the amount of liquid recovered has become less than a prescribed value (step SB3).

Figure 5:
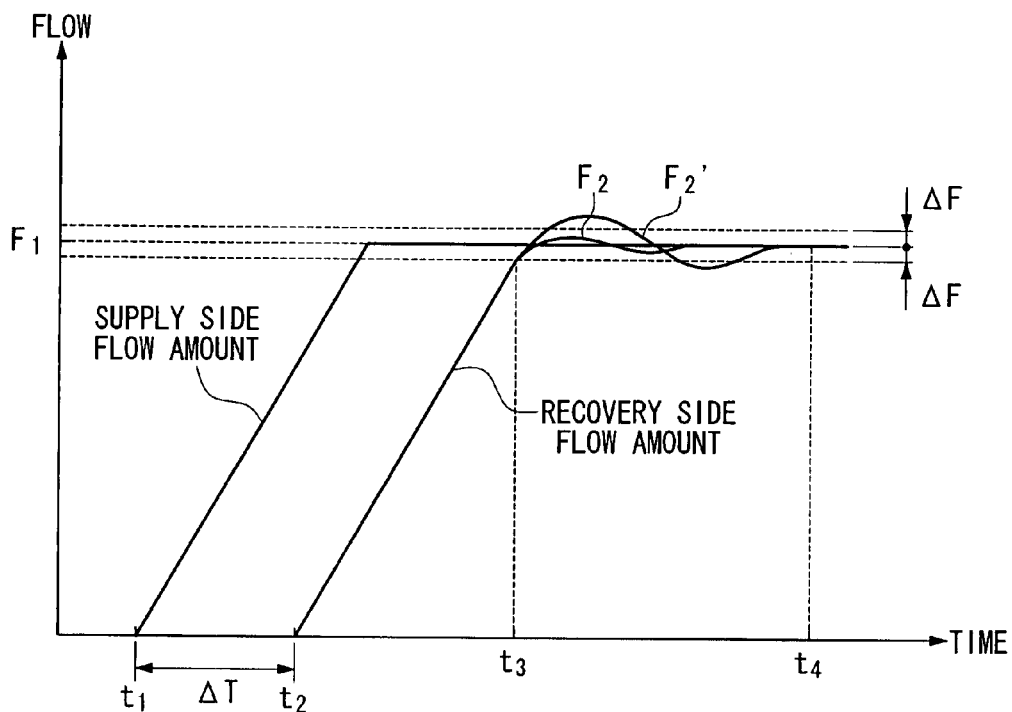
FIG. 5 schematically shows an amount supplied and an amount recovered when filling a space with a liquid.

The abovementioned prescribed value will now be explained, referencing FIG. 5. FIG. 5 is a graph that depicts the relationship between time and the amount of liquid supplied per unit of time by the liquid supply mechanism 10, as well as the amount of liquid recovered per unit of time by the liquid recovery mechanism 20, wherein the horizontal axis represents the time and the vertical axis represents the amount of flow. In FIG. 5, $t_1$ is the point in time when the supply of the liquid by the liquid supply mechanism 10 starts, and $t_2$ is the point in time when the recovery of the liquid by the liquid recovery mechanism 20 starts; in addition, the amount of liquid supplied per unit of time by the liquid supply mechanism 10 and the amount of liquid recovered per unit of time by the liquid recovery mechanism 20 are fixed. In addition, the flow amounts are the values measured by the first flow meters 16 and the second flow meters 26. The time differential $\Delta T$ between time $t_1$ and time $t_2$ is the time differential between the point in time when the liquid LQ fed from the liquid supply part 11 passes through the first flow meters 16 and the point in time when that liquid LQ passes through the second flow meters 26 after filling the space SP; in addition, it arises due to the volume of the passages from the first flow meters 16 to the second flow meters 26. Furthermore, the state wherein the space SP is filled with the liquid LQ and the immersion area AR2 is satisfactorily formed is the state wherein the amount of liquid supplied (i.e., the measurement result of the first flow meters 16) and the amount of liquid recovered (i.e., the measurement result of the second flow meters 26) are substantially equal. Accordingly, the control apparatus CONT determines that the space SP is filled with the liquid LQ and the immersion area AR2 is satisfactorily formed at the point in time when the amount of liquid supplied and the amount of liquid recovered are balanced and there is substantially no longer any difference between the measurement result of the first flow meters 16 and the measurement result of the second flow meters 26. Namely, in FIG. 5, the control apparatus CONT determines that the space SP is filled with the liquid LQ at a time $t_3$ when there is substantially no longer any difference between a measurement result $F_1$ of the first flow meters 16 and a measurement result $F_2$ of the second flow meters 26, and that difference falls below a prescribed value $\Delta F$.

Furthermore, the information related to the prescribed value $\Delta F$ is derived in advance by, for example, experimentation or simulation, and is stored in the storage apparatus MRY.

If the control apparatus CONT determines that the difference between the measurement result of the first flow meters 16 and the measurement result of the second flow meters 26 has fallen below the prescribed value $\Delta F$, then it determines that the space SP, which is between the optical element 2 of the projection optical system PL and the front surface of the substrate P (or the substrate stage PST), is filled with the liquid LQ and has reached the immersed state (step SB4).

At this time, if the abovementioned differential has not fallen below the prescribed value $\Delta F$, then the control apparatus CONT determines that the space SP has not yet reached the immersed state (step SB11). Furthermore, the control apparatus CONT determines whether the preset time limit has elapsed (step SB13). If the abovementioned time limit has not elapsed, then the control apparatus CONT continues the supply and recovery of the liquid LQ by the liquid supply mechanism 10 and the liquid recovery mechanism 20.

However, if the abovementioned time limit has elapsed, then the control apparatus CONT determines that an abnormality has occurred in the exposure apparatus EX and takes prescribed measures (step SB14). For example, if the value of the amount of liquid supplied is large and the abovementioned differential has not fallen below $\Delta F$ at the point in time when the abovementioned time limit has elapsed, then the control apparatus CONT determines that the amount of liquid supplied is excessive, and takes appropriate measures; for example: stops the supply of the liquid LQ by, for example, closing the valves 15 in order to prevent problems like the outflow of the liquid LQ from the substrate P (substrate stage PST); or drives a warning apparatus (for example, an alarm sound or a warning lamp, not shown). However, if the value of the amount of liquid recovered is large and the abovementioned differential has not fallen below $\Delta F$, then the control apparatus CONT determines that the amount of liquid recovered is excessive, and takes appropriate measures, e.g., increases the amount of liquid supplied in order to prevent problems like the depletion of the liquid in the immersion area AR2. Thus, based on the measurement results of the first flow meters 16 and the second flow meters 26, the control apparatus CONT can determine whether an abnormality has occurred in the exposure apparatus EX.

After determining that the space SP is filled with the liquid LQ and has reached the immersed state, the control apparatus CONT uses the focus detection system 30 to detect a gas portion in the liquid LQ that fills the space SP (step SB5). After determining that the immersed state has been reached, the control apparatus CONT may execute the detection of a gas portion after waiting for the elapse of a standby time in order to allow microbubbles to disappear.

After the control apparatus CONT has determined that the space SP is filled with the liquid LQ based on the measurement results of the first flow meters 16 and the second flow meters 26, and after it has verified that there is no gas portion (bubble) in the liquid LQ in the space SP based on the detection result of the focus detection system 30, the optical element 2 of the projection optical system PL and the substrate P are positioned so that they are opposing. Furthermore, the control apparatus CONT continues the supply and recovery of the liquid LQ by the liquid supply mechanism 10 and the liquid recovery mechanism 20, irradiates the exposure light EL while moving the substrate stage PST, which supports the substrate P, in the X axial direction (scanning direction), and exposes the substrate P by projecting the pattern image of the mask M onto the substrate P through the projection optical system PL and the liquid LQ in the space SP (step SB6).

After the immersion exposure of the substrate P ends, the control apparatus CONT closes the passages of the supply pipes 13 by driving the valves 15 and stops the supply of the liquid by the liquid supply mechanism 10. However, the control apparatus CONT continues the recovery of the liquid LQ by the liquid recovery mechanism 20. After the supply of the liquid by the liquid supply mechanism 10 is stopped, the second flow meters 26 measure the amount of the liquid recovered by the liquid recovery mechanism 20 (step SB7).

Based on the measurement result of the second flow meters 26, the control apparatus CONT determines whether the amount of the liquid LQ recovered by the liquid recovery mechanism 20 has become less than a prescribed value (step SB8).

Figure 6:
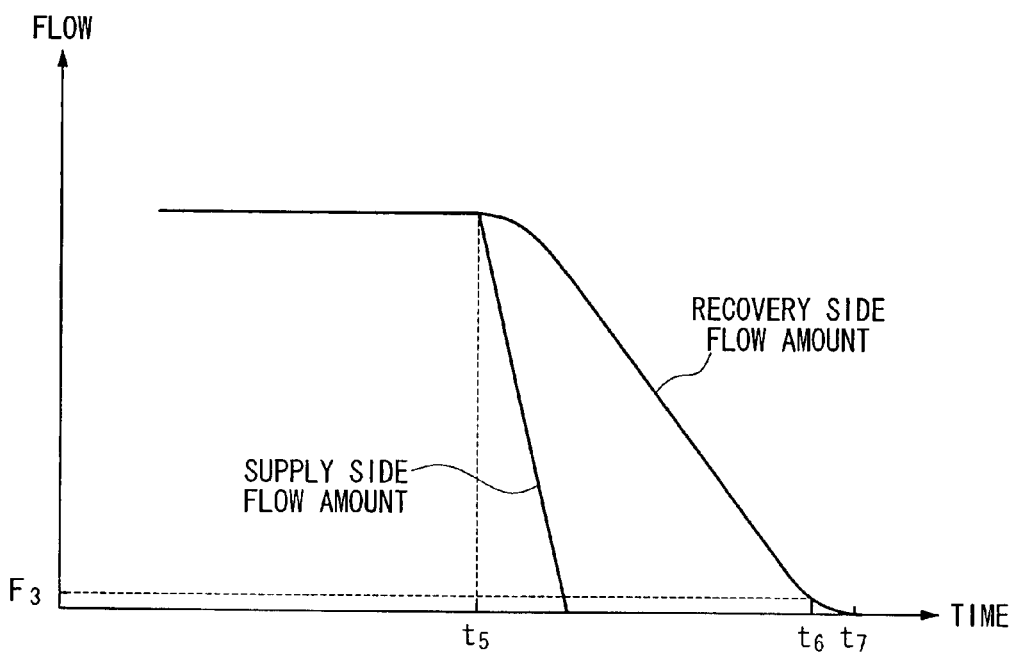
FIG. 6 schematically shows an amount supplied and an amount recovered when recovering the liquid from the space.

The abovementioned prescribed value will now be explained, referencing FIG. 6. FIG. 6 is a graph that depicts the relationship between the time and the amount of the liquid supplied per unit of time by the liquid supply mechanism 10 as well as the amount of the liquid recovered per unit of time by the liquid recovery mechanism 20, wherein the horizontal axis represents the time and the vertical axis represents the amount of flow. In FIG. 6, $t_5$ is the point in time when the supply of the liquid by the liquid supply mechanism 10 is stopped. In addition, the flow amounts are the values measured by the first flow meters 16 and the second flow meters 26. By stopping the supply of the liquid by the liquid supply mechanism 10, the measurement result of the first flow meters 16 rapidly approaches zero. However, after stopping the supply of the liquid by the liquid supply mechanism 10, the liquid recovery mechanism 20 gradually recovers the liquid LQ on the substrate P (substrate stage PST), and, consequently, the measurement result of the second flow meters 26 approaches zero with a gentle slope. Furthermore, the state wherein the liquid LQ that filled the space SP is satisfactorily recovered is the state wherein the amount of liquid recovered (i.e., the measurement result of the second flow meters 26) transitions substantially to zero. Furthermore, at a time $t_6$ when the measurement result of the second flow meters 26 falls below a preset prescribed value $F_3$ (substantially zero), the control apparatus CONT determines that the recovery of the liquid LQ that filled the space SP is complete. Furthermore, information related to this prescribed value $F_3$ is stored in the storage apparatus MRY.

If the control apparatus CONT determines that the measurement result of the second flow meters 26 has fallen below the abovementioned prescribed value $F_3$, then it determines that the recovery of the liquid LQ that filled the space SP, which is between the optical element 2 of the projection optical system PL and the front surface of the substrate P (or the substrate stage PST), is complete, and that the space SP has reached the non-immersed state (step SB9).

At this time, if the control apparatus CONT determines that the measurement result of the second flow meters 26 has not fallen below the abovementioned prescribed value $F_3$, then it determines that the space SP has not yet reached the non-immersed state (step SB12). Furthermore, it determines whether the preset time limit has elapsed (step SB15). If the time limit has not elapsed, then the control apparatus CONT continues the recovery of the liquid LQ by the liquid recovery mechanism 20.

However, if the time limit has elapsed, then the control apparatus CONT determines that an abnormality has occurred in the exposure apparatus EX and takes prescribed measures (step SB16). For example, if the measurement result of the second flow meters 26 has not fallen below the prescribed value $F_3$ even at the point in time when the time limit has elapsed, then there is a possibility that, for example, the supply of the liquid by the liquid supply mechanism 10 was not stopped, or that the liquid LQ leaked midway along the supply pipes 13; consequently, to prevent the leakage of the liquid LQ, the control apparatus CONT takes measures by, for example: stopping the supply of the liquid by closing the valves 15 or stopping the entire operation of the exposure apparatus EX; or driving a warning apparatus (for example, an alarm sound or a warning lamp; not shown). Thus, the control apparatus CONT can determine whether an abnormality has occurred in the exposure apparatus EX based on the measurement result of the second flow meters 26.

After the control apparatus CONT determines that the recovery of the liquid LQ on the substrate P and the substrate stage PST is complete and that the non-immersed state has been reached, it moves the substrate stage PST to the unload position, which is a position spaced apart from the projection optical system PL. Furthermore, the conveyor system (unloading apparatus) unloads the substrate P, for which exposure has finished, on the substrate stage PST at the unload position (step SB10).

Furthermore, if the control apparatus CONT determines in the abovementioned step SB4 that the difference between the measurement result of the first flow meters 16 and the measurement result of the second flow meters 26 has fallen below the prescribed value $\Delta F$, then it determines that the space SP, which is between the optical element 2 of the projection optical system PL and the front surface of the substrate P (or the substrate stage PST), is filled with the liquid LQ. Moreover, by using the first flow meters 16 and the second flow meters 26 in combination with the timer 60, the control apparatus CONT may determine that the space SP is filled with the liquid LQ at a time $t_4$ (refer to FIG. 5) when a prescribed time since the time $t_3$, which is when the differential became smaller than the prescribed value $\Delta F$, has elapsed. In so doing, the exposure process can be performed after waiting for the immersion area AR2 to stabilize. For example, as shown by a symbol $F_2'$ in FIG. 5, even though the abovementioned differential has fallen below $\Delta F$, there is a possibility that the amount of flow on the recovery side will overshoot and unfortunately exceed $\Delta F$ for just a fixed period. If the immersion exposure of the substrate P starts while moving the substrate stage PST in that state, problems will occur, such as the depletion of the liquid in the immersion area AR2, or, conversely, an increased possibility that the liquid LQ will flow out of the immersion area AR2. Accordingly, after the abovementioned differential became smaller than the prescribed value $\Delta F$, it is possible to prevent the occurrence of the abovementioned problems by determining that the space SP is filled with the liquid LQ at the time $t_4$, which is when the prescribed time for stabilizing the amount of liquid supplied and the amount of liquid recovered has elapsed.

In addition, if the control apparatus CONT determines in the above step SB9 that the measurement result of the second flow meters 26 has fallen below the prescribed value $F_3$, then it determines that the recovery of the liquid is complete; however, even in this case, by using the first flow meters 16 and the second flow meters 26 in combination with the timer 60, the control apparatus CONT may determine that the recovery of the liquid is complete at a time $t_7$ (refer to FIG. 6) when a prescribed time since the time $t_6$, which is when the measurement result of the second flow meters 26 falls below the prescribed value $F_3$, has elapsed. In so doing, it is possible to further reduce the possibility that the liquid LQ will remain, and to satisfactorily recover the liquid.

As discussed above, the liquid LQ in the present embodiment comprises pure water. Pure water is advantageous because it can be easily obtained in large quantities at, for example, a semiconductor fabrication plant, and does not adversely impact the optical element (lens), the photoresist on the substrate P, and the like. In addition, because pure water has no adverse impact on the environment and has an extremely low impurity content, it can also be expected to have the effect of cleaning the front surface of the substrate P and the surface of the optical element provided to the tip surface of the projection optical system PL. Furthermore, the exposure apparatus may be provided with an ultrapure water manufacturing apparatus if the pure water supplied from, for example, the plant is of low purity.

Further, the refractive index n of pure water (water) for the exposure light EL that has a wavelength of approximately 193 nm is said to be substantially 1.44; therefore, the use of ArF excimer laser light (193 nm wavelength) as the light source of the exposure light EL would shorten the wavelength on the substrate P to I/n, i.e., approximately 134 nm, and thereby a high resolution would be obtained. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

Furthermore, the numerical aperture NA of the projection optical system may become 0.9 to 1.3 if the liquid immersion method as discussed above is used. If the numerical aperture NA of such a projection optical system increases, then random polarized light conventionally used as the exposure light will degrade imaging performance due to the polarization effect, and it is therefore preferable to use polarized illumination. In that case, it is better to illuminate with linearly polarized light aligned in the longitudinal direction of the line pattern of the line-and-space pattern of the mask (the reticle), and to emit a large amount of diffracted light of the S polarized light component (the TE polarized light component), i.e., the component of the polarized light in the direction along the longitudinal direction of the line pattern, from the pattern of the mask (the reticle). If the liquid is filled between the projection optical system PL and the resist coated on the front surface of the substrate P, then the transmittance through the resist surface increases for the diffracted light of the S polarized light component (the TE polarized light component), which contributes to the improvement of the contrast, compared with the case in which air (a gas) is filled between the projection optical system PL and the resist coated on the front surface of the substrate P, and high imaging performance can consequently be obtained even if the numerical aperture NA of the projection optical system exceeds 1.0. In addition, it is further effective to appropriately combine a phase shift mask and the oblique incidence illumination method (particularly the dipole illumination method) aligned in the longitudinal direction of the line pattern, as disclosed in Japanese Published Patent Application No. H6-188169.

In addition, if a fine line-and-space pattern (e.g., a line-and-space of approximately 25 to 50 nm) is exposed on the substrate P using, for example, an ArF excimer laser as the exposure light and using a projection optical system PL that has a reduction magnification of approximately ¼, then the structure of the mask M (e.g., the fineness of the pattern and the thickness of the chromium) causes the mask M to act as a polarizing plate due to the wave guide effect, and a large amount of diffracted light of the S polarized light component (the TE polarized light component) from the diffracted light of the P polarized light component (the TM polarized light component), which decreases contrast, is emitted from the mask M, and it is therefore preferable to use the linear polarized light illumination discussed above; however, even if the mask M is illuminated with random polarized light, high resolution performance can be obtained even if the numerical aperture NA of the projection optical system PL is as large as 0.9 to 1.3. In addition, if exposing an ultrafine line-and-space pattern of the mask M onto a substrate P, then there is also a possibility that the P polarized light component (the TM polarized light component) will become greater than the S polarized light component (the TE polarized light component) due to the wire grid effect; however, because a greater quantity of diffracted light of the S polarized light component (the TE polarized light component) than the diffracted light of the P polarized light component (the TM polarized light component) is emitted from the mask M if a line-and-space pattern larger than 25 nm is exposed onto the substrate P using, for example, ArF excimer laser light as the exposure light and a projection optical system PL that has a reduction magnification of approximately ¼, high imaging performance can be obtained even if the numerical aperture NA of the projection optical system PL is as large as 0.9 to 1.3.

Furthermore, instead of just linear polarized light illumination (S polarized light illumination) aligned in the longitudinal direction of the line pattern of the mask (reticle), it is also effective to combine the oblique incidence illumination method with the polarized light illumination method that linearly polarizes light in a direction tangential (circumferential) to a circle with the optical axis at the center, as disclosed in Japanese Published Patent Application No. H06-53120. In particular, if the mask (reticle) pattern includes line patterns that extend in a plurality of differing directions instead of just a line pattern that extends in a prescribed single direction, then, by combining the use of the annular illumination method with the polarized light illumination method that linearly polarizes light in a direction tangential to a circle that has the optical axis at its center, as similarly disclosed in Japanese Published Patent Application No. H06-53120, it is possible to achieve high imaging performance even if the numerical aperture NA of the projection optical system is large.

In the present embodiment, the optical element 2 is affixed at the tip of the projection optical system PL, and this lens can adjust the optical characteristics of the projection optical system PL, e.g., aberrations (spherical aberration, coma aberration, and the like). Furthermore, the optical element affixed to the tip of the projection optical system PL may also be an optical plate used to adjust the optical characteristics of the projection optical system PL. Alternatively, it may be a plane parallel plate that is capable of transmitting the exposure light EL therethrough.

Furthermore, if high pressure is generated by the flow of the liquid LQ between the substrate P and the optical element at the tip of the projection optical system PL, then instead of making the optical element replaceable, it may be firmly fixed by that pressure so that it does not move.

Furthermore, the present embodiment is constituted so that the liquid LQ is filled between the projection optical system PL and the front surface of the substrate P, but it may be constituted so that the liquid LQ is filled in a state wherein, for example, a cover glass comprising a plane parallel plate is affixed to the front surface of the substrate P.

In addition, the present embodiment has a constitution wherein the substrate P is exposed after filling the space of the optical path on the light emerging side of the optical member (optical element 2) at the tip of the projection optical system PL with the liquid LQ, but the space of the optical path on the light incident side of the optical element 2 of the projection optical system PL may also be filled with the liquid LQ, as disclosed in PCT International Publication WO2004/019128. In this case, the present invention can also be adapted to supplying the liquid LQ to the space of the optical path on the incident side of the optical element 2, and to recovering the liquid LQ from that space.

Furthermore, although the liquid LQ in the present embodiment is water, it may be a liquid other than water; for example, if the light source of the exposure light EL is an $F_2$ laser, then this $F_2$ laser light will not transmit through water, so it would be acceptable to use a fluorine based fluid as the liquid L,Q, such as perfluorinated polyether (PFPE) or fluorine based oil, that is capable of transmitting $F_2$ laser light. In this case, the parts thereof that make contact with the liquid LQ are treated in order to make them lyophilic by forming a thin film with a substance that has a molecular structure that contains fluorine and that has a low polarity. In addition, it is also possible to use as the liquid LQ one (e.g., cedar oil) that is transparent to the exposure light EL, has the highest possible refractive index, and is stable with respect to the projection optical system PL and the photoresist coated on the front surface of the substrate P. In this case as well, the surface treatment is performed in accordance with the polarity of the liquid LQ used.

Furthermore, the substrate P in each of the abovementioned embodiments is not limited to a semiconductor wafer for fabricating semiconductor devices, and is also applicable to a glass substrate for a display device, a ceramic wafer for a thin film magnetic head, a mask or the original plate of a reticle (synthetic quartz, silicon wafer) used by an exposure apparatus, and the like.

The exposure apparatus EX of the present invention can also be adapted to a step-and-scan type scanning exposure apparatus (scanning stepper) that scans and exposes the pattern of the mask M by synchronously moving the mask M and the substrate P, as well as a step-and-repeat type projection exposure apparatus (stepper) that exposes the full pattern of the mask M, with the mask M and the substrate P in a stationary state, and sequentially steps the substrate P. In addition, the present invention can also be adapted to a step-and-stitch type exposure apparatus that partially and superposingly transfers at least two patterns onto the substrate P.

In addition, the present invention can also be adapted to a twin stage type exposure apparatus as disclosed in Japanese Published Unexaminied Patent Application No. H10-163099, Japanese Published Unexamined Patent Application No. H10-214783 (corresponding U.S. Pat. Nos. 6,341,007, 6,400,441, 6,549,269, and 6,590,634), Published Japanese Translation No. 2000-505958 of the PCT International Publication (corresponding U.S. Pat. No. 5,969,441), U.S. Pat. No. 6,208,407, and the like.

In addition, the present invention can also be adapted to an exposure apparatus that comprises a movable exposure stage that holds a substrate, such as a wafer, to be processed, and a measurement stage, which is equipped with, for example, various measuring members and sensors, as disclosed in Japanese Published Unexamined Patent Application No. 11-135400.

In addition, although the embodiments discussed above adopt an exposure apparatus that locally fills the liquid LQ between the projection optical system PL and the substrate P, the present invention can also be adapted to an immersion exposure apparatus that moves a stage, which holds the substrate to be exposed, in a liquid bath, as disclosed in Japanese Published Unexamined Patent Application No. H6-124873.

The type of exposure apparatus EX is not limited to semiconductor device fabrication exposure apparatuses that expose the pattern of a semiconductor device on the substrate P, but can also be widely adapted to exposure apparatuses for fabricating liquid crystal devices or displays, exposure apparatuses for fabricating thin film magnetic heads, imaging devices (CCDs), or reticles and masks, and the like.

If a linear motor is used in the substrate stage PST or the mask stage MST (refer to U.S. Pat. No. 5,623,853 and U.S. Pat. No. 5,528,118), then either an air levitation type that uses an air bearing, or a magnetic levitation type that uses Lorentz's force or reactance force may be used. In addition, each of the stages PST, MST may be a type that moves along a guide or may be a guideless type.

For the drive mechanism of each of the stages PST, MST, a planar motor may be used that opposes a magnet unit, wherein magnets are arranged two dimensionally, to an armature unit. wherein coils are arranged two dimensionally, and drives each of the stages PST, MST by electromagnetic force. In this case, any one of the magnet unit and the armature unit is connected to the stages PST, MST and the other one should be provided on the moving surface side of the stages PST, MST.

The reaction force generated by the movement of the substrate stage PST may be mechanically discharged to the floor (ground) by using a frame member so that it is not transmitted to the projection optical system PL, as recited in Japanese Published Patent Application No. H08-166475 (U.S. Pat. No. 5,528,118).

The reaction force generated by the movement of the mask stage MST may be 10 mechanically discharged to the floor (ground) by using a frame member so that it is not transmitted to the projection optical system PL, as recited in Japanese Published Patent Application No. H08-330224 (U.S. patent application Ser. No. 08/416,558 filed in 1995.

Furthermore, each of the embodiments discussed above was explained for the supply and recovery of the liquid LQ during the exposure operation, but the present invention is not limited thereto. For example, the present invention can also be adapted to a case wherein the liquid recovery operation and the liquid supply operation are performed independently during maintenance, when resetting the control apparatus CONT, and the like.

The exposure apparatus EX of the embodiments in the present application is manufactured by assembling various subsystems, including each constituent element recited in the claims of the present application, so that prescribed mechanical, electrical, and optical accuracies are maintained, as described above. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus a clean room wherein the temperature, the cleanliness level, and the like are controlled.

Figure 7:
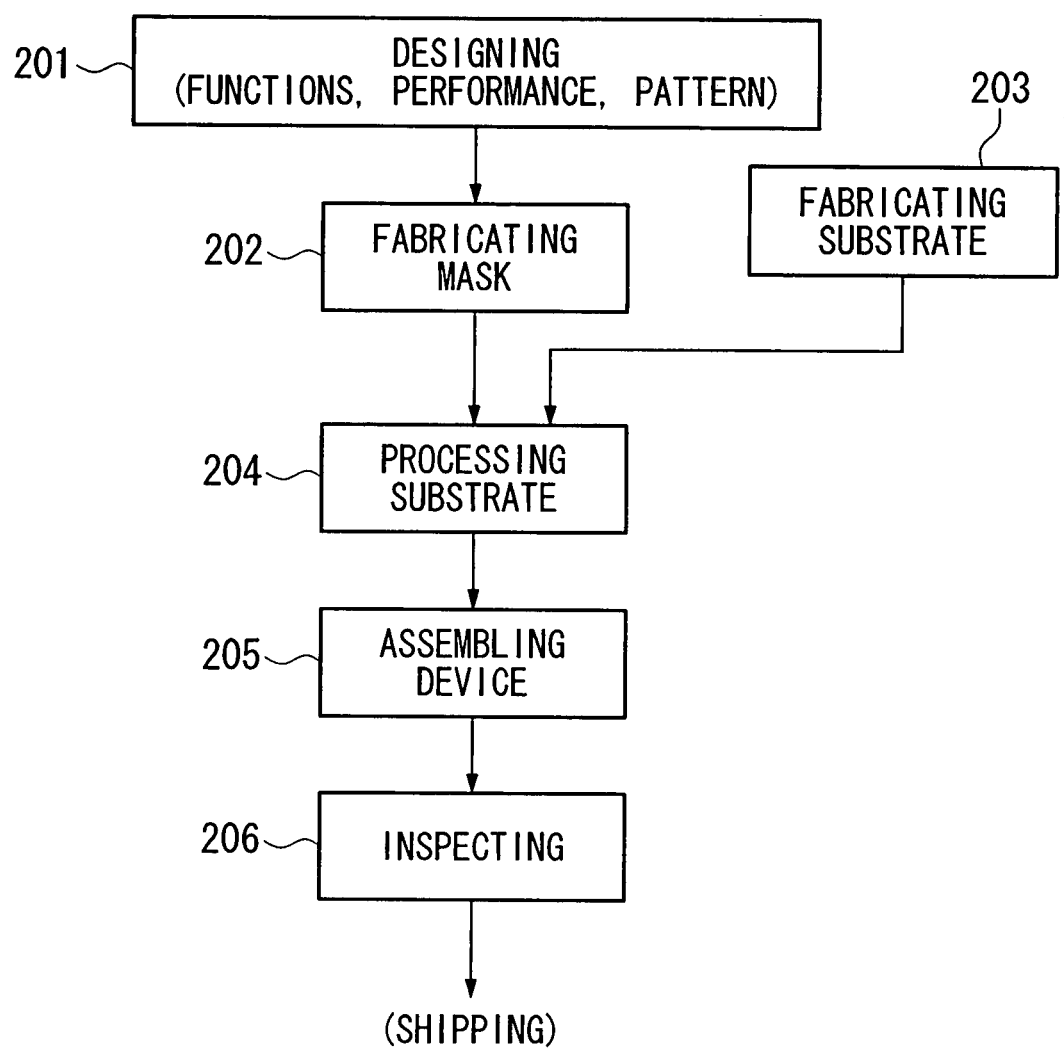
FIG. 7 is a flow chart diagram that depicts one example of a process of fabricating a semiconductor device.

As shown in FIG. 7, a micro-device, such as a semiconductor device is manufactured by: a step 201 that designs the functions and performance of the micro-device; a step 202 that fabricates a mask (reticle) based on this design step; a step 203 that fabricates a substrate, which is the base material of the device; a substrate processing step 204 wherein the exposure apparatus EX of the embodiments discussed above exposes a pattern of the mask onto the substrate; a device assembling step 205 (comprising a dicing process, a bonding process, and a packaging process); an inspecting step 206; and the like.

The invention claimed is:

1. An exposure apparatus that exposes a substrate by irradiating the substrate with exposure light through a projection optical system and a liquid, comprising:
   a liquid supply mechanism that supplies the liquid between an image plane side tip part of the projection optical system and an object that opposes the tip part;
   a timer that measures the time that has elapsed since the supply of the liquid by the liquid supply mechanism was started; and
   a control apparatus that determines, based on a measurement result of the timer, whether a space, which is between the image plane side tip part of the projection optical system and the object and includes at least an optical path of the exposure light, is filled with the liquid.

2. An exposure apparatus according to claim 1, wherein the control apparatus determines, based on the measurement result of the timer, that the space is filled with the liquid when the time that has elapsed since the supply of the liquid was started reaches a prescribed time.

3. An exposure apparatus according to claim 1, wherein the liquid supply mechanism comprises a support port, which supplies the liquid, and a valve, which opens and closes a passage that is connected to the supply port; and the timer starts the measurement of time when the valve has opened the passage.

4. An exposure apparatus according to claim 1, comprising:
   a detector that detects a gas portion in the liquid; wherein, after the control apparatus determines that the space is filled with the liquid, it detects a gas portion in the liquid that filled the space.

5. An exposure apparatus according to claim 1, wherein after the control apparatus determines that the space is filled with the liquid, it irradiates the exposure light.

6. A device fabricating method, comprising the step of: using an exposure apparatus according to claim 1.

7. An exposure apparatus according to claim 1, comprising:
   a liquid recovery mechanism that recovers the liquid while the liquid is being supplied by the liquid supply mechanism; wherein
   the control apparatus determines whether the space is filled with the liquid based upon the measurement result of the timer and information from the liquid recovery mechanism.

8. An exposure apparatus according to claim 7, wherein the measurement result of the timer is an elapsed time since the supply of the liquid was started.

9. An exposure apparatus according to claim 8, wherein the information from the liquid recovery mechanism is an amount of liquid recovered by the liquid recovery mechanism per unit of time.

10. An exposure apparatus according to claim 1, comprising:
    a liquid recovery mechanism that recovers the liquid while the liquid is being supplied by the liquid supply mechanism; wherein
    the control apparatus raises an alert when an amount of liquid recovered by the liquid recovery mechanism does not reach a predetermined value after a lapse of a prescribed time measured by the timer, the prescribed time being the elapsed time since the supply of the liquid was started.

11. An exposure apparatus that exposes a substrate by irradiating the substrate with exposure light through a projection optical system and a liquid, comprising:
    a liquid supply mechanism that supplies the liquid between an image plane side tip part of the projection optical system and an object that opposes the tip part;
    a timer that measures the time that has elapsed since the supply of the liquid by the liquid supply mechanism was stopped;
    a liquid recovery mechanism that recovers the liquid while the liquid is being supplied by the liquid supply mechanism, as well as after such supply has stopped; and
    a control apparatus that determines, based on a measurement result of the timer, whether the liquid has been recovered from the space between the image plane side tip part of the projection optical system and the object.

12. An exposure apparatus according to claim 11, wherein the control apparatus determines, based on the measurement result of the timer, that the liquid has been recovered from the space when the time that has elapsed since the supply of the liquid was stopped reaches a prescribed time.

13. An exposure apparatus according to claim 11, wherein the liquid supply mechanism comprises a supply port, which supplies the liquid, and a valve, which opens and closes a passage that is connected to the supply port; and the timer starts the measurement of time when the valve has closed the passage.

14. An exposure apparatus that exposes a substrate by irradiating the substrate with exposure light through a projection optical system and a liquid, comprising:
    a liquid supply mechanism that supplies the liquid between an image plane side tip part of the projection optical system and an object that opposes the tip part;
    a liquid recovery mechanism that recovers the liquid;
    a first measuring instrument that measures the amount of liquid supplied by the liquid supply mechanism;
    a second measuring instrument that measures the amount of liquid recovered by the liquid recovery mechanism; and
    a control apparatus that determines, based on the measurement results of the first measuring instrument and the second measuring instrument, whether a space, which is between the image plane side tip part of the projection optical system and an object opposing the tip part and includes at least an optical path of the exposure light, is filled with the liquid.

15. An exposure apparatus according to claim 14, wherein the control apparatus determines that the space is filled with the liquid when the difference between the measurement result of the first measuring instrument and the measurement result of the second measuring instrument falls below a prescribed value.

16. An exposure apparatus according to claim 14, wherein the control apparatus determines, based on the difference between the measurement result of the first measuring instrument and the measurement result of the second measuring instrument, whether an abnormality has occurred.

17. An exposure apparatus according to claim 14, wherein after the control apparatus determines that the space is filled with the liquid, it irradiates the exposure light.

18. An exposure apparatus that exposes a substrate by irradiating the substrate with exposure light through a projection optical system and a liquid, comprising:

a liquid supply mechanism that supplies the liquid to a space between an image plane side tip part of the projection optical system and an object that opposes the tip part;

a liquid recovery mechanism that recovers the liquid;

a measuring instrument that measures the amount of liquid recovered by the liquid recovery mechanism since the supply of the liquid by the liquid supply mechanism was stopped; and a control apparatus that determines, based on the measurement result of the measuring instrument, whether the liquid has been recovered from the space.

19. An exposure apparatus according to claim 18, wherein the liquid is recovered while moving a recovery port of the liquid recovery mechanism and the object relative to one another.

20. An exposure apparatus according to claim 13, wherein the object includes the substrate or a movable substrate stage that holds the substrate; and the liquid is filled between the projection optical system and the substrate or a prescribed region on the substrate stage.

21. An exposure apparatus according to claim 18, wherein the control apparatus raises an alert when an amount of liquid recovered by the liquid recovery mechanism does not fall below a predetermined value after a lapse of a prescribed time measured by the timer, the prescribed time being the elapsed time since the supply of the liquid was stopped.

22. A supplying method that supplies a liquid to a space between an image plane side tip part of a projection optical system and an object that opposes the tip part, comprising the steps of:

supplying the liquid to the space;

measuring the time that has elapsed since the start of the supply; and determining that the space is filled with the liquid at a point in time when the elapsed time exceeds a prescribed time.

23. A supplying method according to claim 22, comprising the step of:

exposing a substrate by irradiating the substrate with exposure light through a projection optical system and the liquid after determining that the space is filled with the liquid.

24. An exposing method that supplies a liquid to a space, which is between an image plane side tip part of a projection optical system and an object that opposes the tip part, and exposes the object through the liquid, comprising the steps of:

supplying the liquid using the supplying method according to claim 22.

25. A supplying method that supplies a liquid to a space between an image plane side tip part of a projection optical system and an object that opposes the tip part, comprising the steps of:

simultaneously supplying and recovering the liquid to and from the space;

measuring an amount of liquid supplied and an amount of liquid recovered per unit of time; and determining that the space is filled with the liquid at least one of the point in time when the difference between the amount supplied and the amount recovered has become less than a prescribed value, or the point in time when a prescribed time has elapsed since the difference between the amount supplied and the amount recovered became less than the prescribed value.

26. A recovering method that recovers a liquid that is filled in a space between an image plane side tip part of a projection optical system and an object that opposes the tip part, comprising the steps of:

simultaneously supplying and recovering the liquid to and from the space;

stopping the supply of the liquid;

measuring the time that has elapsed since the stopping; and determining that the recovery of the liquid that filled the space is complete at the point in time when the elapsed time exceeds a prescribed time.

27. A recovering method according to claim 26, comprising the steps of:

exposing a substrate by irradiating the substrate with exposure light through the projection optical system and the liquid prior to stopping the supply of the liquid; and unloading the substrate after it is determined that the recovery of the liquid that filled the space is complete.

28. An exposing method that supplies a liquid to a space, which is between an image plane side tip part of a projection optical system and an object that opposes the tip part, and exposes the object through the liquid, comprising the step of:

recovering the liquid using the recovering method according to claim 26.

29. A recovering method that recovers a liquid that fills a space between an image plane side tip part of a projection optical system and an object that opposes the tip part, comprising the steps of:

simultaneously supplying and recovering the liquid to and from the space;

measuring an amount of liquid supplied and an amount of liquid recovered per unit of time;

stopping the supply of the liquid; and determining that the recovery of the liquid that fills the space is complete at least one of the point in time when the amount recovered has become less than a prescribed amount, or the point in time when a prescribed time has elapsed since the amount recovered became less than a prescribed value.

* * * * *

UNITED STATES PATENT AND TRADEMARK OFFICE
CERTIFICATE OF CORRECTION

PATENT NO. : 8,023,100 B2
APPLICATION NO. : 10/589437
DATED : September 20, 2011
INVENTOR(S) : Kenichi Shiraishi Page 1 of 1

It is certified that error appears in the above-identified patent and that said Letters Patent is hereby corrected as shown below:

On the title page, item [75]: (Inventor); Line 1, Delete "Saitawa (JP)" and insert -- Saitama (JP) --, therefor.
On the title page (Foreign Application Priority Data); Line 1, Delete "P2004-045102" and insert -- 2004-045102 --, therefor.
Column 33, Line 16, In Claim 20, delete "13," and insert -- 18, --, therefor.

Signed and Sealed this
Twelfth Day of March, 2013

Teresa Stanek Rea
*Acting Director of the United States Patent and Trademark Office*